United States Patent
Tachibana et al.

(10) Patent No.: US 11,600,500 B2
(45) Date of Patent: Mar. 7, 2023

(54) SUBSTRATE PROCESSING METHOD

(71) Applicant: Tokyo Electron Limited, Tokyo (JP)

(72) Inventors: Kouzou Tachibana, Koshi (JP); Katsuhiro Morikawa, Koshi (JP); Kouichi Mizunaga, Koshi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 17/371,384

(22) Filed: Jul. 9, 2021

(65) Prior Publication Data

US 2022/0020611 A1 Jan. 20, 2022

(30) Foreign Application Priority Data

Jul. 14, 2020 (JP) .............................. JP2020-120778

(51) Int. Cl.
| | |
|---|---|
| *H01L 21/67* | (2006.01) |
| *H01L 21/687* | (2006.01) |
| *H01L 21/02* | (2006.01) |
| *B08B 3/02* | (2006.01) |
| *B08B 3/08* | (2006.01) |
| *B08B 3/10* | (2006.01) |

(Continued)

(52) U.S. Cl.
CPC ........ *H01L 21/67051* (2013.01); *B08B 3/022* (2013.01); *B08B 3/041* (2013.01); *B08B 3/08* (2013.01); *B08B 3/10* (2013.01); *B08B 13/00* (2013.01); *H01L 21/02057* (2013.01); *H01L 21/67103* (2013.01); *H01L 21/68764* (2013.01); *H05B 1/0233* (2013.01); *H05B 3/265* (2013.01); *B08B 2203/007* (2013.01); *H05B 2203/005* (2013.01)

(58) Field of Classification Search
CPC ......... H01L 21/67051; H01L 21/02057; H01L 21/67103; H01L 21/68764; B08B 3/022; B08B 3/041; B08B 3/08; B08B 3/10; B08B 13/00; B08B 2203/007; H05B 1/0233; H05B 3/265; H05B 2203/005
See application file for complete search history.

(56) References Cited

U.S. PATENT DOCUMENTS

| | | | |
|---|---|---|---|
| 2009/0032067 A1* | 2/2009 | Kojimaru | ........... H01L 21/67034 134/26 |
| 2020/0105550 A1* | 4/2020 | Morikawa | ................. B08B 3/04 |

(Continued)

FOREIGN PATENT DOCUMENTS

JP 3837026 B2 10/2006

*Primary Examiner* — Sharidan Carrillo
(74) *Attorney, Agent, or Firm* — Pearne & Gordon LLP

(57) ABSTRACT

A substrate processing method includes forming, by supplying a chemical liquid onto a central portion of a substrate while rotating a rotary table at a first speed, a liquid film of the chemical liquid having a first thickness; forming, by supplying the chemical liquid onto the central portion while rotating the rotary table at a second speed lower than the first speed after the forming of the liquid film having the first thickness, a liquid film of the chemical liquid having a second thickness larger than the first thickness; and heating, by heating the rotary table in a state that the rotary table is rotated at a third speed lower than the second speed or in a state that the rotating of the rotary table is stopped after the forming of the liquid film having the second thickness, the substrate and the liquid film of the chemical liquid.

15 Claims, 18 Drawing Sheets

(51) Int. Cl.
    *B08B 13/00*    (2006.01)
    *H05B 1/02*    (2006.01)
    *H05B 3/26*    (2006.01)
    *B08B 3/04*    (2006.01)

(56) References Cited

U.S. PATENT DOCUMENTS

| | | | |
|---|---|---|---|
| 2020/0105574 A1* | 4/2020 | Morita | H01L 21/02041 |
| 2022/0020611 A1* | 1/2022 | Tachibana | H01L 21/67051 |
| 2022/0056590 A1* | 2/2022 | Morita | C23C 18/1844 |
| 2022/0130691 A1* | 4/2022 | Tachibana | H01L 21/67046 |

* cited by examiner

SUBSTRATE PROCESSING METHOD

CROSS-REFERENCE TO RELATED APPLICATION

This application claims the benefit of Japanese Patent Application No. 2020-120778 filed on Jul. 14, 2020, the entire disclosure of which is incorporated herein by reference.

TECHNICAL FIELD

The various aspects and embodiments described herein pertain generally to a substrate processing method.

BACKGROUND

In the manufacture of a semiconductor device, a liquid processing such as a chemical liquid cleaning processing or a wet etching processing is performed on a substrate such as a semiconductor wafer by supplying a heated chemical liquid onto the substrate. An example of a single-wafer type substrate processing apparatus configured to perform such a liquid processing is disclosed in Patent Document 1. The apparatus of Patent Document 1 includes a spin chuck configured to hold and rotate the wafer; and a non-rotary disk-shaped member (bottom surface moving member) attachable to/detachable from a bottom surface of the wafer held by the spin chuck. A heater is provided within the bottom surface moving member. A gap of about 0.5 mm to 3 mm is formed between a top surface of the bottom surface moving member and the bottom surface of the wafer W. This gap is filled with the chemical liquid, and the chemical liquid is heated by the heater of the non-rotary bottom surface moving member. By rotating the substrate at a low speed ranging from 30 rpm to 50 rpm by the spin chuck, a chemical liquid processing can be performed on the bottom surface of the wafer by the temperature-controlled chemical liquid while suppressing a stagnation of the chemical liquid in the gap.

Patent Document 1: Japanese Patent No. 3,837,026

SUMMARY

In one exemplary embodiment, there is provided a substrate processing method performed by using a substrate processing apparatus. The substrate processing apparatus includes: a rotary table configured to hold a substrate horizontally and rotate the substrate around a vertical axis; an electric heater provided in the rotary table to be rotated along with the rotary table and configured to heat the substrate placed on the rotary table; at least one processing nozzle configured to supply a processing liquid onto a front surface of the substrate held on the rotary table; and a processing liquid supply device configured to supply the processing liquid to the at least one processing liquid nozzle. The substrate processing method includes: holding the substrate on the rotary table; forming, by supplying a chemical liquid as the processing liquid onto a central portion of the substrate while rotating the rotary table at a first speed, a liquid film of the chemical liquid having a first thickness on an entirety of the front surface of the substrate; forming, by supplying the chemical liquid onto the central portion of the substrate while rotating the rotary table at a second speed lower than the first speed after the forming of the liquid film of the chemical liquid having the first thickness, a liquid film of the chemical liquid having a second thickness larger than the first thickness on the entirety of the front surface of the substrate; and heating, by heating the rotary table with the electric heater in a state that the rotary table is rotated at a third speed equal to or lower than the second speed, in a state that the rotary table is rotated in a rocking manner or in a state that the rotating of the rotary table is stopped after the forming of the liquid film of the chemical liquid having the second thickness, the substrate and the liquid film of the chemical liquid formed on the substrate to thereby accelerate a reaction between the chemical liquid and the front surface of the substrate.

The foregoing summary is illustrative only and is not intended to be any way limiting. In addition to the illustrative aspects, embodiments, and features described above, further aspects, embodiments, and features will become apparent by reference to the drawings and the following detailed description.

BRIEF DESCRIPTION OF THE DRAWINGS

In the detailed description that follows, embodiments are described as illustrations only since various changes and modifications will become apparent to those skilled in the art from the following detailed description. The use of the same reference numbers in different figures indicates similar or identical items.

DETAILED DESCRIPTION

Figure 1:
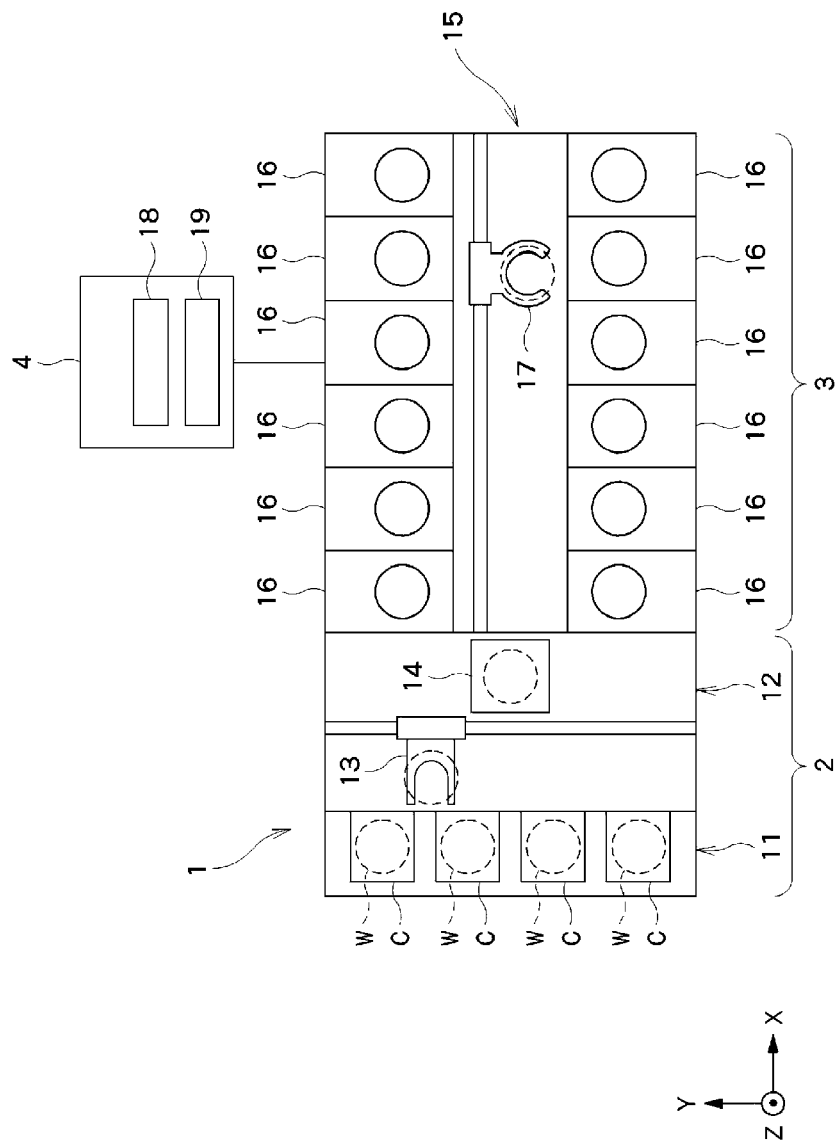
FIG. 1 is a schematic plan view illustrating an overall configuration of a substrate processing apparatus according to an exemplary embodiment.

In the following detailed description, reference is made to the accompanying drawings, which form a part of the description. In the drawings, similar symbols typically identify similar components, unless context dictates otherwise. Furthermore, unless otherwise noted, the description of each successive drawing may reference features from one or more of the previous drawings to provide clearer context and a more substantive explanation of the current exemplary embodiment. Still, the exemplary embodiments described in the detailed description, drawings, and claims are not meant to be limiting. Other embodiments may be utilized, and other changes may be made, without departing from the spirit or scope of the subject matter presented herein. It will be readily understood that the aspects of the present disclosure, as generally described herein and illustrated in the drawings, may be arranged, substituted, combined, separated, and designed in a wide variety of different configurations, all of which are explicitly contemplated herein.

Hereinafter, a substrate processing apparatus (substrate processing system) according to an exemplary embodiment will be described with reference to the accompanying drawings.

FIG. 1 is a plan view illustrating an outline of the substrate processing system according to the exemplary embodiment. In the following, in order to clarify positional relationships, the X-axis, the Y-axis and the Z-axis which are orthogonal to each other will be defined. The positive Z-axis direction will be regarded as a vertically upward direction.

As illustrated in FIG. 1, the substrate processing system 1 includes a carry-in/out station 2 and a processing station 3. The carry-in/out station 2 and the processing station 3 are provided adjacent to each other.

The carry-in/out station 2 is provided with a carrier placing section 11 and a transfer section 12. In the carrier placing section 11, carriers C each accommodating multiple substrates (semiconductor wafers in the present exemplary embodiment) (hereinafter, referred to as "wafers W") horizontally are placed.

The transfer section 12 is provided adjacent to the carrier placing section 11, and provided with a substrate transfer device 13 and a delivery unit 14. The substrate transfer device 13 is provided with a wafer holding mechanism configured to hold the wafer W. Further, the substrate transfer device 13 is movable horizontally and vertically and pivotable around a vertical axis, and transfers the wafer W between the carriers C and the delivery unit 14 by using the wafer holding mechanism.

The processing station 3 is provided adjacent to the transfer section 12. The processing station 3 is provided with a transfer section 15 and a plurality of processing units 16. The processing units 16 are arranged at both sides of the transfer section 15.

The transfer section 15 is provided with a substrate transfer device 17 therein. The substrate transfer device 17 is provided with a wafer holding mechanism configured to hold the wafer W. Further, the substrate transfer device 17 is movable horizontally and vertically and pivotable around a vertical axis. The substrate transfer device 17 transfers the wafers W between the delivery unit 14 and the processing unit 16 by using the wafer holding mechanism.

The processing units 16 perform a predetermined substrate processing on the wafer W transferred by the substrate transfer device 17.

Further, the substrate processing system 1 is equipped with a control device 4. The control device 4 is, for example, a computer, and includes a controller 18 and a storage 19. The storage 19 stores therein a program that controls various processings performed in the substrate processing system 1. The controller 18 controls the operation of the substrate processing system 1 by reading and executing the program stored in the storage 19.

Further, the program may be recorded in a computer-readable recording medium and may be installed to the storage 19 of the control device 4 from this recording medium. The computer-readable recording medium may be, by way of non-limiting example, a hard disk (HD), a flexible disk (FD), a compact disk (CD), a magnet optical disk (MO), a memory card, or the like.

In the substrate processing system 1 configured as described above, the substrate transfer device 13 of the carry-in/out station 2 first takes out the wafer W from the carrier C placed in the carrier placing section 11, and then places the taken wafer W on the delivery unit 14. The wafer W placed on the delivery unit 14 is taken out from the delivery unit 14 by the substrate transfer device 17 of the processing station 3 and carried into the processing unit 16.

The wafer W carried into the processing unit 16 is processed by the processing unit 16, and then taken out from the processing unit 16 and placed on the delivery unit 14 by the substrate transfer device 17. After the processing of placing the wafer W on the delivery unit 14, the wafer W returns back into the carrier C of the carrier placing section 11 by the substrate transfer device 13.

Now, a configuration of the processing unit 16 according to the exemplary embodiment will be explained. The processing unit 16 is configured as a single-wafer liquid processing unit.

Figure 2:
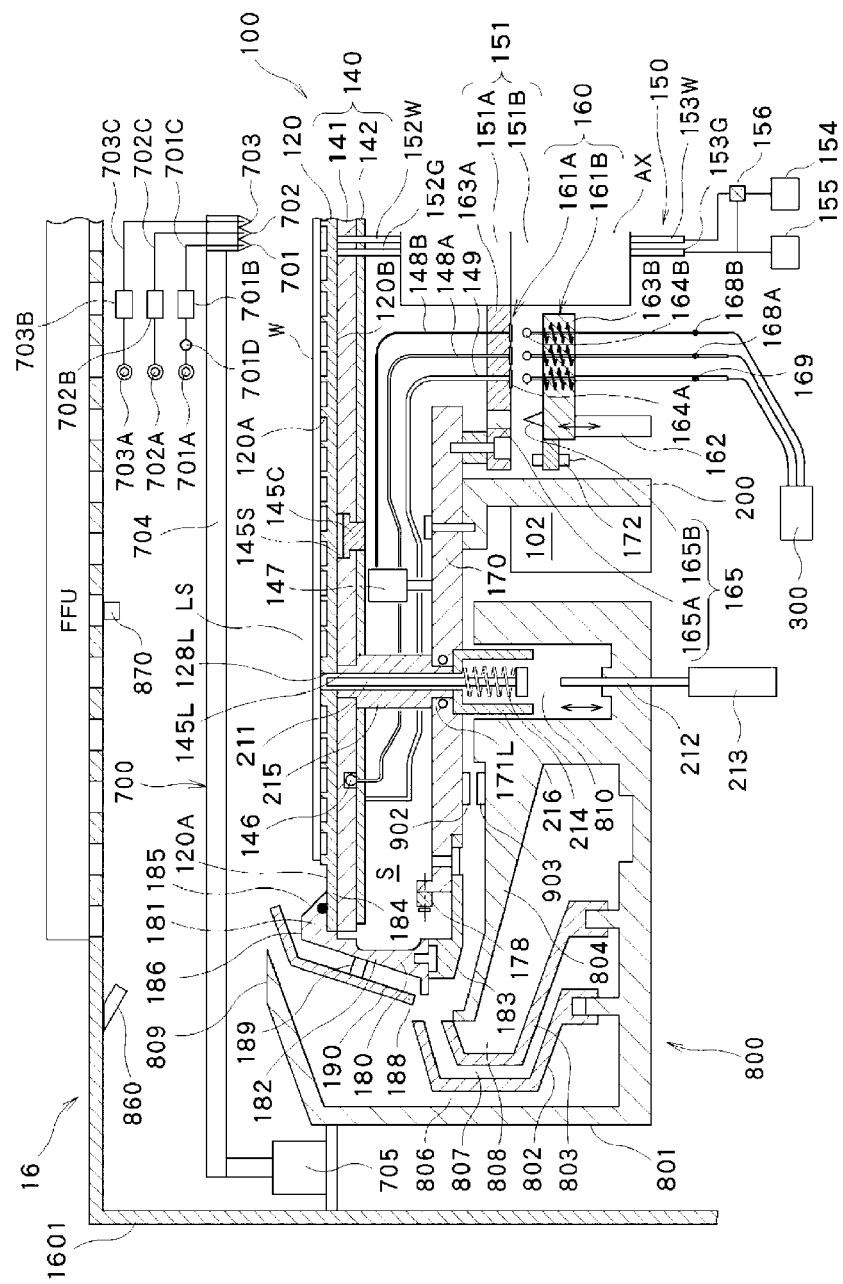
FIG. 2 is a schematic cross sectional view illustrating an example configuration of a processing unit belonging to the substrate processing apparatus of FIG. 1.

As depicted in FIG. 2, the processing unit 16 is equipped with a rotary table 100, a processing liquid supply 700 configured to supply a processing liquid onto the wafer W, and a liquid recovery cup (processing cup) 800 configured to receive the processing liquid scattered from the substrate being rotated. The rotary table 100 is capable of holding and rotating a circular substrate such as the wafer W horizontally. The constituent components of the processing unit 16 such as the rotary table 100, the processing liquid supply 700 and the liquid recovery cup 800 are accommodated in a housing 1601 (also referred to as a "processing chamber").

FIG. 2 illustrates only the left half of the processing unit 16. The processing unit 16 has a substantially symmetrical structure with respect to a rotation axis Ax illustrated at the right end of FIG. 2. To secure a dynamic balance of the rotary table 100 when it rotates, one or more balance weights 178 may be mounted to the rotary table 100.

The rotary table 100 includes an attraction plate 120, a hot plate 140, a support plate 170, a periphery cover body 180 and a hollow rotation shaft 200. The attraction plate 120 is configured to attract the wafer W placed thereon horizontally. The hot plate 140 serves as a base plate of the attraction plate 120, and is configured to support and heat the attraction plate 120. The support plate 170 is configured to support the attraction plate 120 and the hot plate 140.

The rotation shaft 200 extends downwards from the support plate 170. The rotary table 100 is rotated around a vertically extending rotation axis Ax by an electric driving unit (rotation driving device) 102 disposed around the rotation shaft 200, so that the wafer W held by the rotary table 100 can be rotated around the rotation axis Ax. The electric driving unit 102 (details of which are not illustrated) is configured to transfer a motive power generated by an electric motor to the rotation shaft 200 via a power transmission mechanism (for example, a belt and a pulley) to rotate the rotation shaft 200. Alternatively, the electric driving unit 102 may be configured to rotate the rotation shaft 200 directly by the electric motor.

The attraction plate 120 is a circular plate-shaped member having a diameter slightly larger than a diameter of the wafer W (or equal to the diameter of the wafer W depending on the configuration), that is, having an area larger than or equal to an area of the wafer W. The attraction plate 120 has a top surface (front surface) 120A configured to attract a bottom surface (a surface which is not a processing target) of the wafer W; and a bottom surface (rear surface) 120B which is in contact with a top surface of the hot plate 140. The attraction plate 120 may be made of a material having high thermal conductivity such as thermal conductive ceramics, for example, SiC. Desirably, the thermal conductivity of the material forming the attraction plate 120 is equal to or higher than 150 W/m·k.

The hot plate 140 is a circular plate-shaped member having a diameter substantially equal to the diameter of the attraction plate 120. The hot plate 140 has a plate main body 141 and an electric heater 142 provided in the plate main body 141. The plate main body 141 is made of a material having high thermal conductivity such as thermal conductive ceramics, for example, SiC. Desirably, the thermal conductivity of the material forming the plate main body 141 is equal to or higher than 150 W/m·k.

Figure 3:
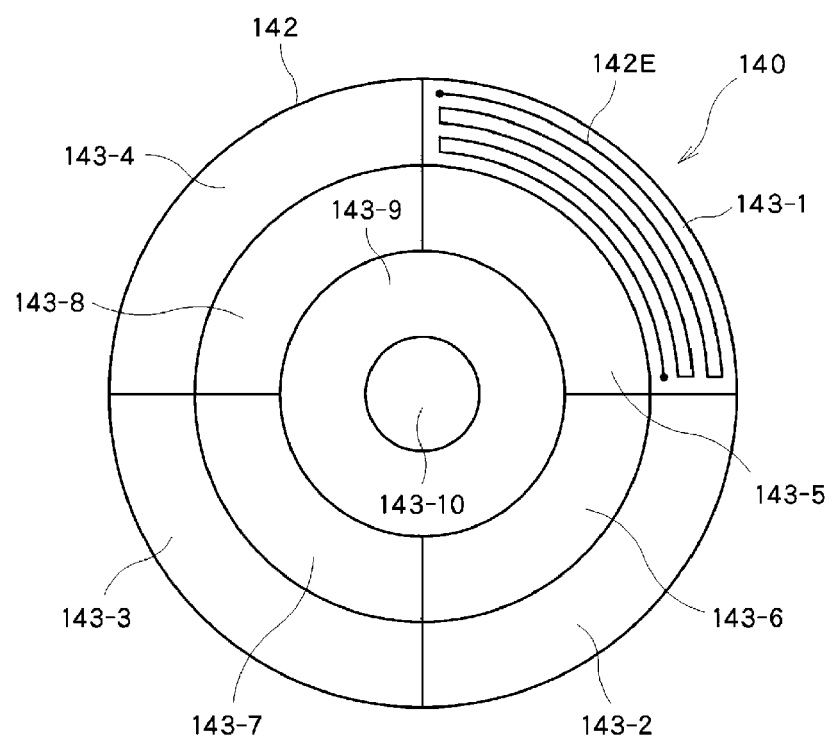
FIG. 3 is a schematic plan view illustrating an example layout of a heater of a hot plate provided in the processing unit.

The heater 142 may be a surface-shaped heater such as a polyimide heater provided on a bottom surface (rear surface) of the plate main body 141. Desirably, a multiple number of (for example, ten) heating zones 143-1 to 143-10 are set in the hot plate 140, as illustrated in FIG. 3. The heater 142 are composed of a multiple number of heater elements 142E respectively provided in the heating zones 143-1 to 143-10. Each heater element 142E is formed of a conductor extending in a zigzag shape within the corresponding one of the heating zones 143-1 to 143-10. FIG. 3 illustrates only the heater element 142E within the heating zone 143-1.

Power can be fed to these heater elements 142E independently by a power feeder 300 to be described later. Accordingly, different heating zones of the wafer W can be heated under different conditions, so that a temperature distribution of the wafer W can be controlled.

Figure 4:
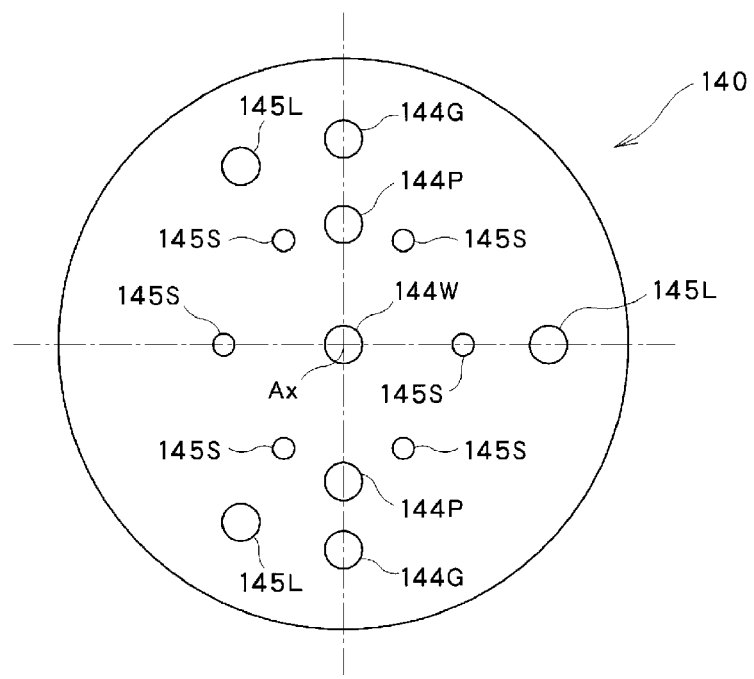
FIG. 4 is a schematic plan view illustrating an example structure of a top surface of the hot plate.

As shown in FIG. 4, one or more (two in the shown example) plate suction holes 144P, one or more (one at a central portion in the shown example) substrate suction hole 144W, one or more (two at an outer side in the shown example) purge gas supply holes 144G are formed at the top surface (front surface) of the plate main body 141. The plate suction holes 144P are used to transfer a suction force for attracting the attraction plate 120 to the hot plate 140. The substrate suction hole 144W is used to transfer a suction force for attracting the wafer W to the attraction plate 120.

Further, the plate main body 141 is provided with a plurality of (three in the shown example) lift pin holes 145L through which lift pins 211 to be described later pass; and a multiplicity of (six in the shown example) service holes 145S for accessing assembly screws of the rotary table 100. In a typical operation mode, the service holes 145S are closed with caps 145C.

The aforementioned heater elements 142E are arranged, avoiding the plate suction holes 144P, the substrate suction hole 144W, the purge gas supply holes 144G, the lift pin holes 145L and the service holes 145S. Further, by achieving the connection to the rotation shaft 200 through an electromagnet, the service holes may be omitted.

Figure 5:
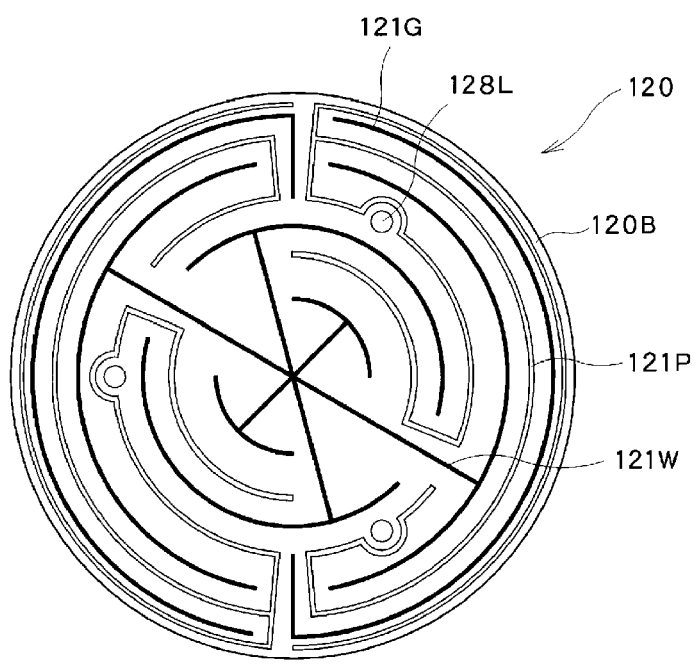
FIG. 5 is a schematic plane view illustrating an example structure of a bottom surface of an attraction plate provided in the processing unit.

As shown in FIG. 5, a plate bottom surface suction path groove 121P, a substrate bottom surface suction path groove 121W, a bottom surface purge path groove 121G are formed at the bottom surface 120B of the attraction plate 120. When the attraction plate 120 is placed on the hot plate 140 with an appropriate positional relationship, at least a part of the plate bottom surface suction path groove 121P communicates with the plate suction hole 144P. Likewise, at least a part of the substrate bottom surface suction path groove 121W communicates with the substrate suction hole 144W, and at least a part of the bottom surface purge path groove 121G communicates with the purge gas supply hole 144G. The plate bottom surface suction path groove 121P, the substrate bottom surface suction path groove 121W and the bottom surface purge path groove 121G are disconnected from each other (do not communicate with each other).

Figure 10:
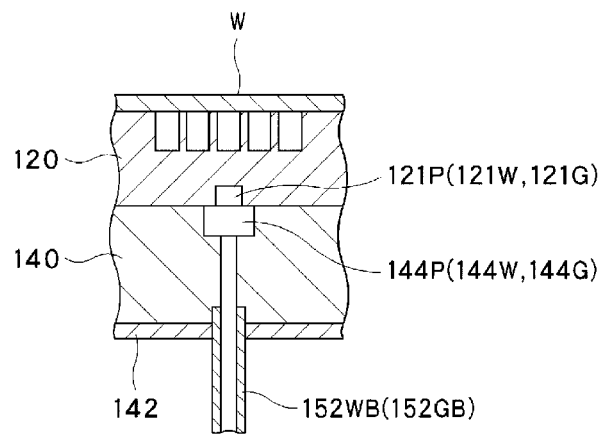
FIG. 10 is a schematic cross sectional view illustrating the attraction plate taken along a line different from that of FIG. 9.

FIG. 10 schematically illustrates a state in which the suction hole 144P (or 144W, or 144G) of the hot plate 140 are overlapped with and communicate with the path groove 121P (or 121W, or 121G) of the attraction plate 120.

Figure 6:
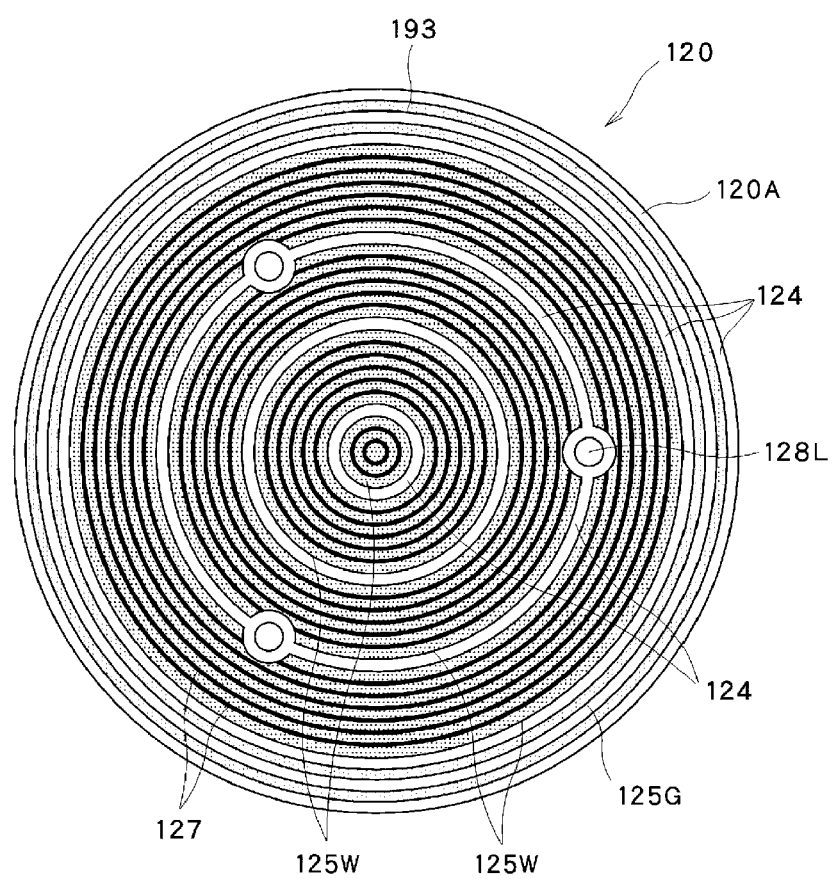
FIG. 6 is a schematic plan view illustrating an example structure of a top surface of the attraction plate.
Figure 9:
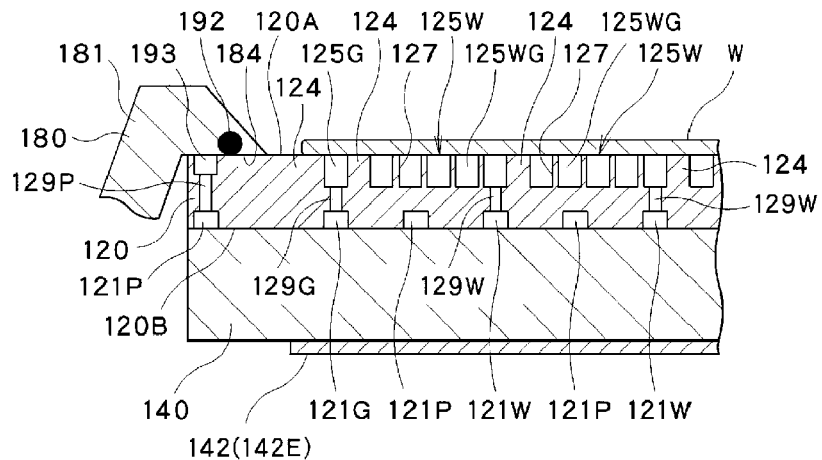
FIG. 9 is a schematic cross sectional view illustrating the attraction plate shown in FIG. 5 and FIG. 6.

As illustrated in FIG. 6 and FIG. 9, a plurality of (five in the shown example) thick ring-shaped partition walls 124 is formed on the top surface 120A of the attraction plate 120. The thick partition walls 124 form, at the top surface 120A, a plurality of recess regions 125W and 125G (four annular regions at outer sides and one circular region at the innermost side) which are disconnected from each other.

Through holes 129W, which are formed through the attraction plate 120 in a thickness direction thereof, are formed at the substrate bottom surface suction path groove 121W, and each through hole allows the substrate bottom surface suction path groove 121W to communicate with the corresponding one of the plurality of (four in the shown example) recess regions 125W.

Further, through holes 129G, which are formed through the attraction plate 120 in the thickness direction thereof, are formed at the bottom surface purge path groove 121G, and each through hole allows the bottom surface purge path groove 121G to communicate with the outermost recess region 125G. The outermost recess region 125G serves as a top surface purge path groove having a single circular ring shape.

Substantially ring-shaped narrow separation walls 127 are concentrically provided within each of the four recess regions 125W located at the inner side. The narrow separation wall 127 forms at least one top surface suction path groove which extends in a zigzag shape within each recess region 125W. That is, the narrow separation wall 127 serves to distribute the suction force in a uniform manner within each recess region 125W.

As depicted in FIG. 2, a suction/purge unit 150 is provided in the vicinity of the rotation axis Ax. The suction/purge unit 150 is equipped with a rotary joint 151 provided within the hollow rotation shaft 200. An upper piece 151A of the rotary joint 151 is connected with a suction line 152W communicating with the plate suction hole 144P and the substrate suction hole 144W of the hot plate 140; and a purge gas supply line 152G communicating with the purge gas supply hole 144G.

Though not shown, the suction line 152W may be branched into a branch suction line, and this branch suction line may be connected to the plate main body 141 of the hot plate 140 directly under the plate suction hole 144P and the substrate suction hole 144W. In this case, vertically extending through holes may be formed through the plate main body 141, and the branch suction line may be connected to each through hole. Likewise, the purge gas supply line 152G may be branched, and this branch purge gas supply line may be connected to the plate main body 141 of the hot plate 140 directly under the purge gas supply hole 144G. In this configuration, vertically extending through holes may be formed through the plate main body 141, and the branch purge gas supply line may be connected to each through hole. The aforementioned branch suction line and the branch purge gas supply line are schematically illustrated in FIG. 10 (see reference numerals 152WB and 152GB, respectively).

Alternatively, the suction line 152W and the purge gas supply line 152G may be connected to a central portion of the plate main body 141 of the hot plate 140. In this case, a path through which the suction line 152W is allowed to communicate with the plate suction hole 144P and the substrate suction hole 144W and a path through which the purge gas supply line 152G is allowed to communicate with the purge gas supply hole 144G are provided within the plate main body 141.

The lower piece 151B of the rotary joint 151 is connected with a suction line 153W communicating with the suction line 152W; and a purge gas supply line 153G communicating with the purge gas supply line 152G. The rotary joint 151 is configured such that the upper piece 151A and the lower piece 151B can be rotated relative to each other while the communication between the suction lines 152W and 153W and the communication between the purge gas supply lines 152G and 153G are maintained. The rotary joint 151 itself having this function is one commonly known.

The suction line 153W is connected to a suction device 154 such as a vacuum pump. The purge gas supply line 153G is connected to a purge gas supply device 155. The suction line 153W is also connected to the purge gas supply device 155. Further, there is also provided a switching device 156 (for example, a three-way valve) configured to switch the connection destination of the suction line 153W between the suction device 154 and the purge gas supply device 155.

The hot plate 140 has therein a multiple number of temperature sensors 146 configured to detect a temperature of the plate main body 141 of the hot plate 140. For example, the temperature sensors 146 may be provided for, for example, the ten heating zones 143-1 to 143-10 in one-to-one correspondence. Based on a deviation between a detection value of each temperature sensor 146 and a target value (target temperature), a power to the heater element 142E of each of the heating zones 143-1 to 143-10 is controlled by a control function provided in the power feeder 300, so that a temperature of each heating zone is maintained at the target value. Further, at least one thermo switch 147 is provided near the heater 142 of the hot plate 140 to detect overheating of the heater 142.

Besides the temperature sensors 146 and the thermo switch 147, control signal lines (first conductive lines) 148A and 148B for transmitting detection signals of the temperature sensors 146 and the thermo switch 147 and a power feed line (first conductive line) 149 for feeding power to each heater element 142E of the heater 142 are provided in a space S between the hot plate 140 and the support plate 170.

As depicted in FIG. 2, a switch device 160 is provided in the vicinity of the rotary joint 151. The switch device 160 includes a first electrode unit 161A fixed with respect to the direction of the rotation axis Ax; a second electrode unit 161B configured to be movable in the direction of the rotation axis Ax; and an electrode moving device 162 (elevating device) configured to move the second electrode unit 161B up and down in the direction of the rotation axis Ax. Here, the first electrode unit 161A and the second electrode unit 161B only need to be configured to be movable relative to each other in the direction of the rotation axis Ax. That is, an electrode moving device (not shown) may move the first electrode unit 161A in the direction of the rotation axis Ax, and the second electrode unit 161B may be fixed with respect to the direction of the rotation axis Ax.

Figure 7:
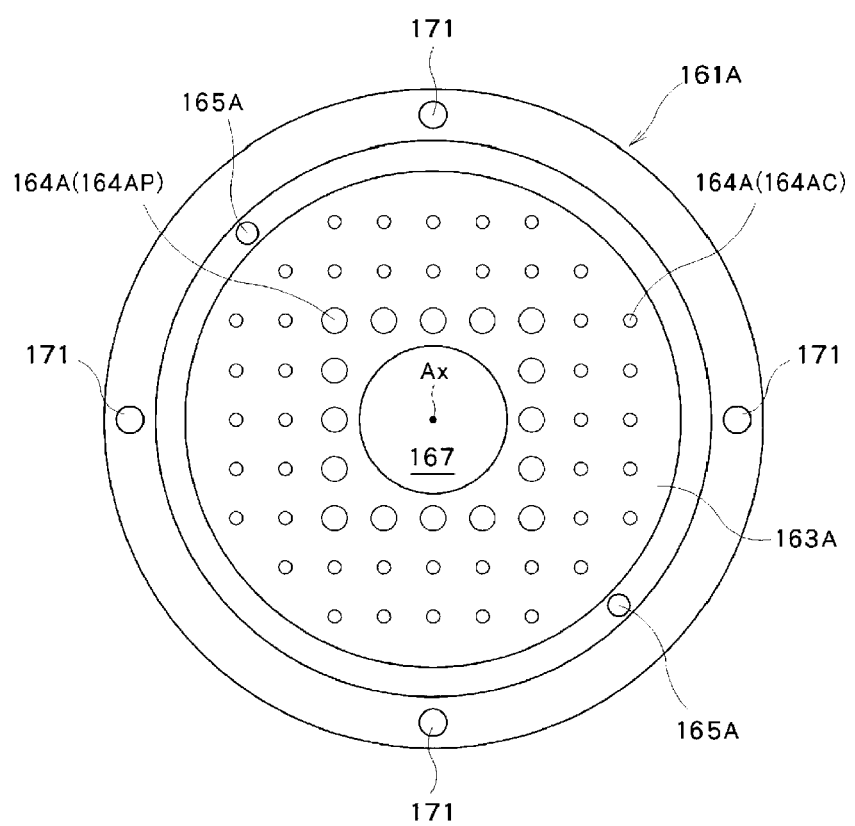
FIG. 7 is a schematic plan view illustrating an example configuration of a first electrode unit provided in the processing unit.

As illustrated in FIG. 7, the first electrode unit 161A is equipped with a first electrode supporting body 163A and a plurality of first electrodes 164A supported by the first electrode supporting body 163A. The first electrodes 164A include first electrodes 164AC (indicated by small 'O' in FIG. 7) for control signal communication connected to the control signal lines 148A and 148B; and first electrodes 164AP (indicated by large 'O' in FIG. 7) for heater power feed connected to the power feed line 149.

The first electrode supporting body 163A is a circular plate-shaped member in overall having a substantially circular shape when viewed from the direction of the rotation axis Ax. Formed at a central portion of the first electrode supporting body 163A is a circular hole 167 into which the upper piece 151A of the rotary joint 151 is inserted. The upper piece 151A of the rotary joint 151 may be fixed to the first electrode supporting body 163A. A peripheral portion of the first electrode supporting body 163A may be screw-coupled to the support plate 170 by using screw holes 171.

As schematically illustrated in FIG. 2, the second electrode unit 161B is equipped with a second electrode supporting body 163B and a plurality of second electrodes 164B supported by the second electrode supporting body 163B. In overall, the second electrode supporting body 163B is a circular plate-shaped member having the same diameter as that of the first electrode supporting body 163A shown in FIG. 7. Formed at a central portion of the second electrode supporting body 163B is a circular hole through which the lower piece 151B of the rotary joint 151 can pass.

The second electrodes 164B configured to be connected to/disconnected from the first electrodes 164A by being moved up and down with respect to the first electrodes 164A have the same layout as that of the first electrodes 164A. Hereinafter, the second electrodes 164B (power feeding electrode) configured to come into contact with the first electrodes 164AP (power receiving electrode) for heater power feed will also be referred to as "second electrodes 164BP". Further, the second electrodes 164B configured to be brought into contact with the first electrodes 164AC for control signal communication will also be referred to as "second electrodes 164BC". The second electrodes 164BP are connected to a power output terminal of a power feed device (power feeder) 300. The second electrodes 164BC are connected to a control input/output terminal of the power feeder 300.

As shown in FIG. 7, the first electrodes 164AP for heater power feed are provided at a central region of the first electrode supporting body 163A, and the first electrodes 164AC for control signal communication are provided at a peripheral region outside the central region. Among the first electrodes 164A, the first electrodes 164AP are also referred to as "first electrode group," and the first electrodes 164AC are also referred to as "second electrode group."

Apparently, the second electrodes 164B (164BP, 164BC) are disposed at positions (positions in the horizontal direction and the height direction) appropriate for the first electrodes 164A (164AP, 164AC) which make pairs, respectively, and description of a layout of the second electrodes 164B will be omitted.

At least a part of conductive paths (second conductive lines) 168A, 168B and 169 (see FIG. 2) connecting the second electrodes 164B and the power output terminal and the control input/output terminal of the power feeder 300 is made of a flexible wire. Due to the flexible wire, the entire second electrode unit 161B can be rotated around the rotation axis Ax in a forward rotation direction and in a backward rotation direction from a neutral position within a preset angular range (that is, a limited angular range) while maintaining the electric conduction between the second electrodes 164B and the power feeder 300. The preset angular range may be, by way of example, 180 degrees, but not limited thereto. This means that the rotary table 100 can be rotated about ±180 degrees while maintaining the connection between the first electrodes 164A and the second electrodes 164B.

One of the first electrode 164A and the second electrode 164B in each pair may be configured as a pogo pin. In FIG. 2, all the second electrodes 164B are configured as the pogo pins. Here, the term "pogo pin" is widely used to imply an extensible/contractible rod-shaped electrode having a spring embedded therein. Instead of the pogo pin, a socket, a magnet electrode, an induction electrode, or the like may be used as the electrode.

Desirably, there may be provided a lock device 165 configured to lock the first electrode supporting body 163A and the second electrode supporting body 163B not to be rotated relative to each other when the first electrode 164A and the second electrode 164B in each pair are in appropriate contact with each other. By way of example, as shown in FIG. 2 and FIG. 8, the lock device 165 may be composed of a hole 165A provided at the first electrode supporting body 163A; and a pin 165B provided at the second electrode supporting body 163B and configured to be fitted into the hole 165A.

It may be desirable to provide a sensor 172 (schematically illustrated in FIG. 2) configured to detect an appropriate contact between the first electrode 164A and the second electrode 164B in each pair. This sensor 172 may be an angular position sensor (not shown) configured to detect a state in which an angular positional relationship between the first electrode supporting body 163A and the second electrode supporting body 163B is appropriate. Alternatively, this sensor 172 may be a distance sensor (not shown) configured to detect a state in which a distance between the first electrode supporting body 163A and the second electrode supporting body 163B in the direction of the rotation axis Ax is appropriate. Still alternatively, a contact type sensor (see FIG. 8) configured to detect an appropriate engagement of the pin 165B into the hole 165A of the lock device 165 may be provided.

Figure 8:
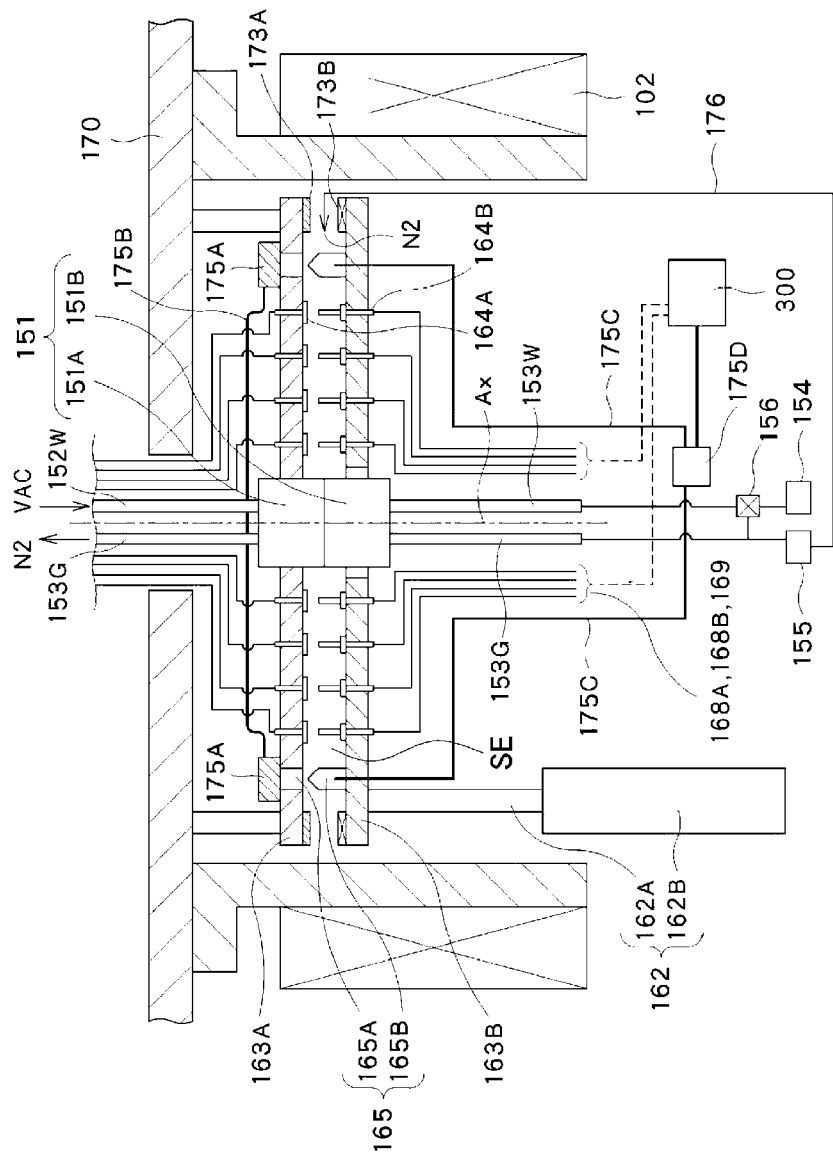
FIG. 8 is a schematic enlarged cross sectional view illustrating a structure near the first electrode unit and a second electrode unit shown in FIG. 2.

To configure the contact-type sensor illustrated in FIG. 8, two holes 165A and two pins 165B are provided. Desirably, the pins 165B are made of a conductive material, and the first electrode supporting body 163A is made of an insulating material. The first electrode supporting body 163A is provided with two electrodes 175A and a conducting member composed of a conductive member 175B connecting these two electrodes 175A electrically. The two electrodes 175A are provided at positions respectively corresponding to the two holes 165A. The two pins 165B are connected to a conduction sensor 175D via a conductive member 175C. If each pin 165B is inserted into the corresponding hole 165A, an end of the pin 165B comes into contact with the electrode 175A, and this contact is detected by the conduction sensor 175D.

It is desirable that the power feeder 300 has a control function of enabling the power feed to the electric heater 142 only when the appropriate engagement between the hole 165A and the pin 165B is detected by the conduction sensor 175D. With this control function, an electric discharge between the second electrode 164BP and the first electrode 164AP for heater power feed can be suppressed, so that a damage on the electrodes or the electric circuit can be avoided.

The electrode moving device 162 schematically illustrated in FIG. 2 may be equipped with, as depicted in FIG. 8, a push rod 162A configured to push the second electrode supporting body 163B upwards; and an elevating device 162B (an air cylinder, a ball screw, or the like) configured to move the push rod 162A up and down. At least one permanent magnet 173A may be provided at the first electrode supporting body 163A, and at least one electromagnet 173B may be provided at the second electrode supporting body 163B. The permanent magnet 173A and the electromagnet 173B constitute a part of the aforementioned lock device 165. With this configuration, when necessary, the first electrode unit 161A and the second electrode unit 161B can be connected by an electromagnetic attracting force such that they cannot be movable relative to each other in the vertical direction, and the first electrode unit 161A and the second electrode unit 161B can be disconnected from each other by an electromagnetic repulsive force. Desirably, a plurality of permanent magnets 173A and the same number of electromagnets 173B are provided, and these permanent magnets 173A and electromagnets 173B are arranged at a regular distance therebetween in a circumferential direction around the rotation axis Ax.

If the connection/disconnection between the first electrode unit 161A and the second electrode unit 161B are performed at the same angular position on the rotary table 100, the second electrode unit 161B need not be supported to be rotatable around the rotation axis Ax. That is, only a member (for example, the aforementioned push rod 162A, or another support table) configured to support the second electrode unit 161B when the first electrode unit 161A and the second electrode unit 161B are disconnected from each other needs to be provided. When the first electrode unit 161A and the second electrode unit 161B are connected by, for example, an electromagnetic force, the second electrode unit 161B may be distanced apart from the member (for example, the push rod 162A or another support table) which serves to support the second electrode unit 161B.

The electric driving unit 102 of the rotary table 100 has a positioning function of stopping the rotary table 100 at a certain rotational angular position. This positioning function can be implemented by rotating a motor of the electric driving unit 102 based on a detection value of a rotary encoder embedded in the rotary table 100 (or a member rotated by the rotary table 100). By raising the second electrode unit 161B with the electrode moving device 162 while keeping the rotary table 100 stopped at the preset rotational angular position, corresponding electrodes of the first electrode unit 161A and the second electrode unit 161B can be brought into contact with each other appropriately. When disconnecting the second electrode unit 161B from the first electrode unit 161A, it is desirable to perform this disconnection in the state that the rotary table 100 is stopped at the preset rotational angular position.

As stated above, the various electronic components (heater, wiring, sensors) are disposed within the space S between the attraction plate 120 and the support plate 170 and at the positions facing the space S. The periphery cover body 180 suppresses a processing liquid supplied to the wafer W, particularly, a corrosive chemical liquid from entering the space S, thus protecting the electronic components. A purge gas ($N_2$ gas) may be supplied into the space S through a pipeline (not shown) branched from the purge gas supply line 152G. By supplying the purge gas into the space S in this way, a corrosive gas originated from the chemical liquid can be suppressed from reaching the inside of the space S from the outside thereof, so that the space S can be maintained in a non-corrosive atmosphere.

Particularly, it is desirable to provide an inert gas supply device configured to supply an inert gas ($N_2$ gas) into a space SE between the first electrode supporting body 163A and the second electrode supporting body 163B in which the first electrodes of the first electrode unit and the second electrodes of the second electrode unit come into contact with each other. This inert gas supply device may be composed of the purge gas supply device 155 and an inert gas supply line 176 for supplying the $N_2$ gas as the inert gas into the space SE from the purge gas supply device 155. That is, the purge gas supply device 155 configured to supply the $N_2$ gas as the purge gas into the space S may also be used as the inert gas supply device configured to supply the $N_2$ gas as the inert gas into the space SE. During the operation of the processing unit 16, it is desirable that the inert gas is supplied into the space SE constantly. Accordingly, since surfaces of the electrodes are maintained in a good condition, reliability of the operation of the processing unit 16 can be improved.

To supply the inert gas ($N_2$ gas) into the space SE, a dedicated inert gas source provided separately from the purge gas supply device 155 may be used. Further, if the space SE can be filled with the $N_2$ gas by supplying the $N_2$ gas as the purge gas into the space S, this dedicated inert gas supply device for the space SE need not be provided.

As shown in FIG. 2, the periphery cover body 180 has an upper portion 181, a side peripheral portion 182 and a lower portion 183. The upper portion 181 is protruded above the attraction plate 120 and connected to the attraction plate 120. The lower portion 183 of the periphery cover body 180 is coupled to the support plate 170.

An inner edge of the upper portion 181 of the periphery cover body 180 is located at an inner side than an outer edge of the attraction plate 120 in a radial direction thereof. The upper portion 181 has a circular ring-shaped bottom surface 184 in contact with the top surface of the attraction plate 120; an inclined circular ring-shaped inner peripheral surface 185 starting from an inner edge of the bottom surface 184; and a circular ring-shaped outer peripheral surface 186 extending substantially horizontally outwards in the radial direction from an outer edge of the inner peripheral surface 185. The inner peripheral surface 185 is inclined to be lowered as it approaches the central portion of the attraction plate 120.

It is desirable to provide a seal between the top surface 120A of the attraction plate 120 and the bottom surface 184 of the upper portion 181 of the periphery cover body 180 to suppress the liquid from being introduced. The seal may be an O-ring 192 (see FIG. 9) disposed between the top surface 120A and the bottom surface 184.

As depicted in FIG. 5, a part of the plate bottom surface suction path groove 121P extends in the circumferential direction at the outermost portion of the attraction plate 120. Further, as shown in FIG. 6, a groove 193 extends continuously in the circumferential direction at the outermost portion of the top surface 120A of the attraction plate 120. As illustrated in FIG. 9, the plate bottom surface suction path groove 121P at the outermost portions and the groove 193 communicate with each other via multiple through holes 129P which are formed through the attraction plate 120 in a thickness direction and arranged at a regular distance therebetween in the circumferential direction. The bottom surface 184 of the upper portion 181 of the periphery cover body 180 is placed on the groove 193. Accordingly, the bottom surface 184 of the upper portion 181 of the periphery cover body 180 is attracted to the top surface 120A of the attraction plate 120 by a negative pressure acting on the plate bottom surface suction path groove 121P. Since the O-ring 192 is squashed through this attraction, secure sealing is achieved.

A height of the outer peripheral surface 186, that is, a top portion of the periphery cover body 180 is higher than a height of the top surface of the wafer W held by the attraction plate 120. Accordingly, if the processing liquid is supplied onto the top surface of the wafer W in the state that the wafer W is held by the attraction plate 120, it is possible to form a liquid accumulation in which the wafer W can be immersed so that the top surface of the wafer W is located under a liquid surface LS (see FIG. 2). That is, the upper portion 181 of the periphery cover body 180 forms an embankment surrounding the wafer W held by the attraction plate 120, and a recess portion in which the processing liquid can be stored is formed by the upper portion 181 of the periphery cover body 180 and the attraction plate 120. By using this structure, an immersing processing for the wafer W can be performed.

An inclination of the inner peripheral surface 185 of the upper portion 181 of the periphery cover body 180 facilitates outward scattering of the processing liquid within the aforementioned recess portion when the rotary table 100 is rotated at a high speed. That is, this inclination suppresses the liquid from staying on the inner peripheral surface of the upper portion 181 of the periphery cover body 180 when the rotary table 100 is rotated at the high speed.

Further, in a chemical liquid processing (to be described later in detail) disclosed in the present specification, the wafer W is not immersed in a tub filled with the processing liquid, but a liquid accumulating processing of forming a puddle of the processing liquid on a surface of the wafer W is performed. If the immersion of the wafer W is not performed, the height of the upper portion 181 of the periphery cover body 180 may be lower than the shown example, and the inclination of the inner peripheral surface 185 may be smaller than the shown example.

A rotary cup 188 (rotary liquid-receiving member) configured to be rotated along with the periphery cover body 180 is provided at an outside of the periphery cover body 180 in the radial direction. The rotary cup 188 is connected to a constituent component of the rotary table 100, that is, the periphery cover body 180 in the shown example, via a plurality of connecting members 189 arranged at a regular distance therebetween in the circumferential direction. An upper end of the rotary cup 188 is located at a height where the processing liquid scattered from the wafer W can be received. A passageway 190 through which the processing liquid scattered from the wafer W flows down is formed between an outer surface of the side peripheral portion 182 of the periphery cover body 180 and an inner surface of the rotary cup 188.

A liquid recovery cup 800 surrounds the rotary table 100 and collects the processing liquid scattered from the wafer W. In the shown exemplary embodiment, the liquid recovery cup 800 includes a stationary outer cup component 801, a first movable cup component 802 and a second movable cup component 803 configured to be movable up and down, and a stationary inner cup component 804. A first drain passageway 806, a second drain passageway 807 and a third drain passageway 808 are formed between the neighboring cup components (that is, between 801 and 802, between 802 and 803, and between 803 and 804). By varying the positions of the first and second movable cup components 802 and 803, the processing liquid flown out from the passageway 190 between the periphery cover body 180 and the rotary cup 188 can be guided into a selected one of the three drain passageways 806 to 808. Each of the first drain passageway 806, the second drain passageway 807 and the third drain passageway 808 is connected to any one of an acidic liquid drain passageway, an alkaline liquid drain passageway and an organic liquid drain passageway (all of which are not illustrated) which are provided in a semiconductor manufacturing factory. A non-illustrated gas-liquid separating structure is provided within each of the first drain passageway 806, the second drain passageway 807 and the third drain passageway 808. The first drain passageway 806, the second drain passageway 807 and the third drain passageway 808 are connected to and suctioned by a factory exhaust system via an exhaust device (not shown) such as an ejector. This liquid recovery cup 800 is well-known by Japanese Patent Laid-open Publication No. 2012-129462, Japanese Patent Laid-open Publication No. 2014-123713, Japanese laid-open publication pertinent to the present application by the present applicant, and so forth. For details of this liquid recovery cup, these documents may be referred to.

Three lift pin holes 128L and three lift pin hoes 171L are formed at the attraction plate 120 and the support plate 170, respectively, to be aligned with the three lift pin holes 145L of the hot plate 140 in the direction of the rotation axis Ax.

The rotary table 100 is equipped with a plurality of (three in the shown example) lift pins 211 inserted through the lift pin holes 145L, 128L and 171L. The lift pins 211 can be moved between a transfer position (raised position) where an upper end of the lift pin 211 protrudes above the top surface 120A of the attraction plate 120 and a processing position (lowered position) where the upper end of the lift pin 211 is located under the top surface 120A of the attraction plate 120.

A push rod 212 is provided under each lift pin 211. The push rod 212 can be moved up and down by an elevating device 213, for example, an air cylinder. By pushing lower ends of the lift pins 211 upwards with the push rods 212, the lift pins 211 can be raised to the transfer position. Alternatively, the push rods 212 may be provided at a ring-shaped support body (not shown) centered on the rotation axis Ax and moved up and down by moving the ring-shaped support body up and down by a common elevating device.

The wafer W placed on the lift pins 211 at the transfer position is located at a height position higher than an upper end 809 of the stationary outer cup component 801, and this wafer W can be transferred to/from an arm (see FIG. 1) of the substrate transfer device 17 advanced into the processing unit 16.

If the push rod 212 is distanced away from the lift pin 211, the lift pin 211 is lowered down to the processing position by an elastic force of a return spring 214 and held at this processing position. In FIG. 2, a reference numeral 215 denotes a guide member configured to guide the vertical movement of the lift pin 211, and a reference numeral 216 indicates a spring seat configured to receive the return spring 214. Further, a circular ring-shaped recess 810 is formed at the stationary inner cup component 804 to allow rotation of the spring seat 216 around the rotation axis Ax.

The processing liquid supply 700 is equipped with a multiple number of nozzles. These nozzles include a chemical liquid nozzle 701, a rinse nozzle 702, and a drying accelerator liquid nozzle 703. A chemical liquid is supplied into the chemical liquid nozzle 701 from a chemical liquid source 701A via a chemical liquid supply mechanism 701B including a flow control device (not shown) such as a flow rate control valve and an opening/closing valve which are provided at a chemical liquid supply line (pipeline) 701C. A rinse liquid is supplied into the rinse nozzle 702 from a rinse liquid source 702A via a rinse liquid supply mechanism 702B including a flow control device (not shown) such as a flow rate control valve and an opening/closing valve which are provided at a rinse liquid supply line (pipeline) 702C. A drying accelerator liquid, for example, IPA (Isopropyl Alcohol) is supplied into the drying accelerator liquid nozzle 703 from a drying accelerator liquid source 703A via a drying accelerator liquid supply mechanism 703B including a flow control device (not shown) such as a flow rate control valve and an opening/closing valve which are provided at a drying accelerator supply line (pipeline) 703C.

The chemical liquid supply line 701C may be equipped with a heater 701D as a temperature control device for controlling a temperature of the chemical liquid. Further, a tape heater (not shown) for controlling the temperature of the chemical liquid may be provided at a pipeline constituting the chemical liquid supply line 701C. Likewise, the rinse liquid supply line 702C may also be equipped with such a heater.

The chemical liquid nozzle 701, the rinse nozzle 702 and the drying accelerator liquid nozzle 703 are supported by a leading end of a nozzle arm 704. A base end of the nozzle arm 704 is supported by a nozzle arm driving device 705 configured to move up and down and rotate the nozzle arm 704. The chemical liquid nozzle 701, the rinse nozzle 702 and the drying accelerator liquid nozzle 703 can be placed at a certain position above the wafer W in the radial direction of the wafer W (a position with respect to the radial direction of the wafer W) by the nozzle arm moving device 705.

Disposed at a ceiling of the housing 1601 are a wafer sensor 860 configured to detect a presence or absence of the wafer W on the rotary table 100 and one or more infrared thermometers 870 (only one is illustrated) configured to detect a temperature of the wafer W (or a temperature of the processing liquid on the wafer W). In a configuration in which multiple infrared thermometers 870 are provided, it is desirable that the individual infrared thermometers 870 are configured to detect a temperature of regions of the wafer W corresponding to the heating zones 143-1 to 143-10, respectively.

Figure 11A:
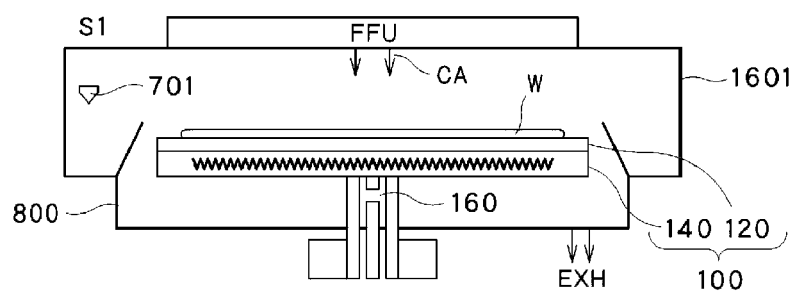
FIG. 11A to FIG. 11P are diagrams illustrating a sequence of a chemical liquid processing.

Now, referring to FIG. 11A to FIG. 11P, an operation of the substrate processing apparatus will be described for an example case where it performs a chemical liquid processing on the wafer W. Here, a chemical liquid may be, for example, a chemical liquid for a wet etching processing or a chemical liquid for a cleaning processing. Further, in FIG. 11A to FIG. 11P, the number of arrows extending downwards from the FFU approximately corresponds to a flow rate of a gas supplied from the FFU into the processing chamber 1601. A notation CA stands for clean air, and a notation DA stands for dry air. A gas exhaust rate from the liquid recovery cup 800 approximately corresponds to the number of arrows marked by EXH. Further, in FIG. 11A to FIG. 11P, S1 to S16 written on the left of the FFU imply that the drawings correspond to processes 1 to 16, respectively.

In the following description, processing parameters are denoted as follows, for the simplicity of description.

The item "plate heating switch" indicates a state of the switch device 160. "ON" indicates a state in which the second electrode unit 1616 of the switch device 160 is raised to be brought into electric contact with the first electrode unit 161A so power is being fed to the hot plate 140. "OFF" denotes a state (opened state) in which the second electrode unit 1616 of the switch device 160 is lowered to be spaced apart from the first electrode unit 161A.

The item "plate temperature" indicates a temperature of the attraction plate 120 of the rotary table 100 on which the wafer W is placed. The temperature of the attraction plate 120 increases as a result of being heated by the hot plate 140. It can be assumed that the temperature of the wafer W is substantially identical to the temperature of the attraction plate 120 upon a lapse of a certain time after the wafer W is attracted to the attraction plate 120 as one body therewith.

The item "chamber feed rate" indicates a flow rate of the gas fed into the housing (processing chamber) 1601 from the FFU (fan filter unit (see FIG. 2)).

The item "cup exhaust rate" indicates a flow rate of the gas exhausted from the liquid recover cup 800.

The time "wafer rotation" indicates a rotation number of the wafer W rotated by the rotary table 100. When the wafer W is rotated in the same direction continuously, only the rotation number will be written. When the wafer W is rotated in a rocking manner (rotated forward and backward alternately), it will be written as "rocking rotation".

The item "chemical liquid nozzle" indicates presence or absence of a discharge of the chemical liquid from the chemical liquid nozzle 701, and a position of the chemical liquid nozzle 701 (specified only when the chemical liquid is discharged).

The item "rinse nozzle" indicates presence or absence of a discharge of the rinse liquid (here, DIW) from the rinse nozzle 702, and a position of the rinse nozzle 702 (specified only when the rinse liquid is discharged).

The item "IPA nozzle" indicates presence or absence of a discharge of the IPA as the drying accelerator liquid from the drying accelerator liquid nozzle 703, and a position of the drying accelerator liquid nozzle 703 (specified only when the IPA is discharged).

[Process 1 (Wafer Holding Process)]

The arm of the substrate transfer device 17 (see FIG. 1) holding the wafer W having a room temperature (e.g., about 24° C.) advances into the processing unit 16 to be placed directly above the attraction plate 120 having the room temperature (e.g., about 24° C.). Further, the lift pins 211 are placed at the transfer position. In this state, the arm of the substrate transfer device 17 is lowered. Accordingly, the wafer W is placed on the upper ends of the lift pins 211 and distanced apart from the arm. Then, the arm of the substrate transfer device 17 is retreated out of the processing unit 16. Subsequently, the suction device 154 is operated, so that the attraction plate 120 is attracted to the hot plate 140, and an attracting force starts to act on the surface of the attraction plate 120. In this state, the lift pins 211 are lowered down to the processing position, and in the meanwhile, the wafer W is placed on the top surface 120A of the attraction plate 120 to be attracted to the attraction plate 120 instantly.

Thereafter, the wafer sensor 860 inspects whether the wafer W has been appropriately attracted to the attraction plate 120. As the wafer W is attracted to the attraction plate 120, heat is transferred to the wafer W from the hot plate 140 through the attraction plate 120. Thus, the wafer W can be heated efficiently, and the temperature control can be performed accurately for each heating zone.

The purge gas (e.g., $N_2$ gas) is constantly supplied to the outermost recess region 125G on the top surface of the attraction plate 120 from the purge gas supply device 155. Accordingly, even if there exists a gap between the contact surfaces of the peripheral portion of the bottom surface of the wafer W and the peripheral portion of the attraction plate 120, the processing liquid is suppressed from being introduced somewhere between the peripheral portion of the wafer W and the peripheral portion of the attraction plate 120 through this gap.

Processing conditions for the process 1 are specified as follows. Hereinafter, though not particularly mentioned in the description of other processes, the chamber feed rate may be set to be slightly larger than the cup exhaust rate to maintain the inside of the processing chamber 1601 under a slightly positive pressure.

Plate heating switch: OFF
Plate temperature: 24° C. (23° C. to 27° C.)
Chamber feed rate: slightly larger than 0.4 $m^3$/min
Cup exhaust rate: 0.4 $m^3$/min
Wafer rotation number: 0 rpm
Chemical liquid nozzle: no discharge
Rinse nozzle: no discharge
IPA nozzle: no discharge

[Process 2 (Preliminary Heating Process)]

Subsequently, the switch device 160 is turned ON, and the power is fed to the hot plate 140 so that the hot plate 140 emits heat. Accordingly, the attraction plate 120 and the wafer W attracted thereto are heated to 65° C. (see FIG. 11B). Here, the temperature of 65° C. is slightly higher (60° C.+$\alpha$° C.) than a chemical liquid processing temperature (here, 60° C.) to be described later.

After the completion of the process 2, since the power is not fed to the hot plate until the process 5 is begun, the temperature of the attraction plate 120 and the wafer W decreases due to heat dissipation. In the process 2, this temperature decrease is compensated. That is, the temperature $\alpha$° C. needs to be set to allow the temperature of the attraction plate 120 and the wafer W at the beginning of the process 5 to become substantially identical to the chemical liquid processing temperature. Since a control target temperature of the hot plate 140 (or the wafer W) at the beginning of the process 5 is equal to the chemical liquid processing temperature (here, 60° C.), a temperature control is begun in the state that there is almost no difference between the control target temperature and the actual temperature. Therefore, a hunting, an overshoot, or the like may hardly occur. Hence, an etching amount by the chemical liquid itself can be made approximate to a target value, and in-surface uniformity of the etching amount can be improved.

Here, $\alpha$° C. can be set to be an appropriate temperature within a range from 0° C. to 10° C. (or a range from 0° C. to 5° C.). To decide the value of $\alpha$° C., heat capacities of the attraction plate 120 and members thermally connected thereto are considered. The process 2 is performed for, e.g., 35 seconds. This 35 seconds substantially corresponds to, for example, a time required for the temperature of the attraction plate 120 and the wafer W to increase from the room temperature up to 65° C. which is the temperature slightly higher than the chemical liquid processing temperature.

Figure 11B:
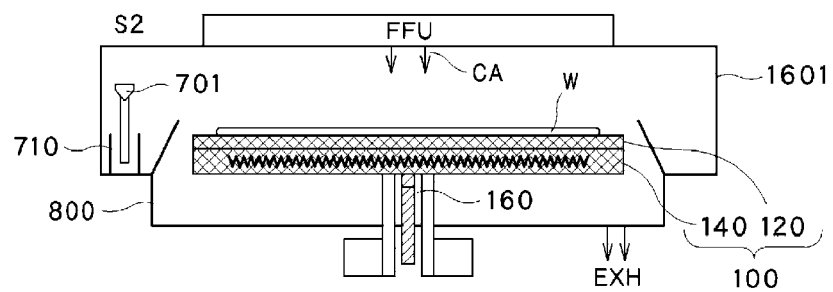

During the temperature-increasing period (for example, about 35 seconds), a dummy dispense of the chemical liquid is performed from the chemical liquid nozzle 701 toward a dummy dispense port (schematically illustrated only in FIG. 11B by assigning a reference numeral 710). The temperature of the chemical liquid staying in the chemical liquid supply line 701C connected to the chemical liquid nozzle 701 decreases due to heat dissipation. By discharging this low-temperature chemical liquid from the chemical liquid supply line 701C through the dummy dispense immediately before the chemical liquid is discharged onto the wafer W from the chemical liquid nozzle 701, the chemical liquid having the required temperature can be supplied to the wafer W, starting from immediately after the discharge of the chemical liquid is begun. The dummy dispense is performed until the temperature T of the chemical liquid discharged from the chemical liquid nozzle 701 reaches a predetermined temperature Tp higher than the room temperature.

This temperature Tp may be set to be substantially equal to the chemical liquid processing temperature Tc in the process 5. Accordingly, a burden (a power required for heating) on the hot plate 140 can be reduced. Since, however, the burden on the hot plate 140 can be reduced to some extent as long as the temperature Tp is higher than the room temperature at least, the temperature Tp may be set to be a temperature higher than the room temperature and lower than the chemical liquid processing temperature Tc.

Further, the dummy dispense port 710 is provided at a position corresponding to a home position (a standby position outside the liquid recovery cup 800 shown in FIG. 11B) of the liquid discharge nozzle (here, the chemical liquid nozzle 701), as well known in the pertinent art. The dummy dispense port 710 is configured to receive the chemical liquid discharged from the liquid discharge nozzle. The liquid received by the dummy dispense port 710 may be collected to be used again or drained into a factory waste liquid system. Since cleanness of the chemical liquid discharged into the dummy dispense port from the chemical liquid nozzle 701 is high, it can be collected to be reused.

Processing conditions for the process 2 are as follows.
Plate heating switch: ON
Plate temperature: 65° C.
Chamber feed rate: slightly larger than 0.4 m$^3$/min
Cup exhaust rate: 0.4 m$^3$/min
Wafer rotation number: 0 rpm
Chemical liquid nozzle: discharge at the dummy dispense position
Rinse nozzle: no discharge
IPA nozzle: no discharge

[Process 3]

Figure 11C:
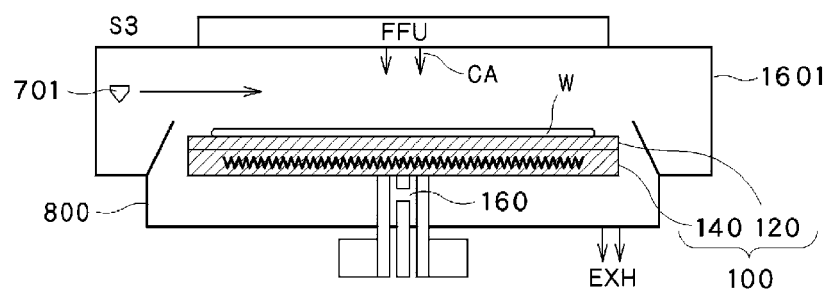

Thereafter, as depicted in FIG. 11C, the switch device 160 is turned OFF. Accordingly, the temperature of the attraction plate 120 and the wafer W declines slowly. Further, the chemical liquid nozzle 701 is moved to a position directly above a central portion of the wafer W. Processing conditions of the process 3 are specified as follows.
Plate heating switch: OFF
Plate temperature: no control (decreases slowly due to heat dissipation)
Chamber feed rate: slightly larger than 0.4 m$^3$/min
Cup exhaust rate: 0.4 m$^3$/min
Wafer rotation number: 0 rpm
Chemical liquid nozzle: no discharge (moved to directly above the central portion of the wafer W)
Rinse nozzle: no discharge
IPA nozzle: no discharge

[Process 4 (Liquid Film Forming Process and Film Thickness Adjusting Process)]

Figure 11D:
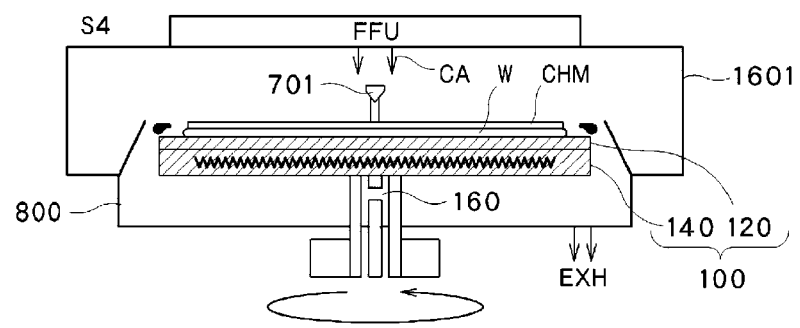

Then, as shown in FIG. 11D, while rotating the wafer W at a high speed (e.g., 500 rpm or higher; specifically, about 1000 rpm, for example), the chemical liquid of, e.g., about 60° C. is supplied onto the center of the wafer W from the chemical liquid nozzle 701. Thereafter, while carrying on the supply of the chemical liquid onto the center of the wafer W from the chemical liquid nozzle 701, the rotation speed of the wafer W is reduced to a low speed of about 10 rpm.

The chemical liquid supplied onto the central portion of the wafer W being rotated at the high speed is diffused onto an entirety of the front surface (entire front surface) of the wafer W by a centrifugal force instantly (for example, in less than 1 second). As a result, the entire front surface of the wafer W is covered with a thin liquid film of the chemical liquid. This process can be regarded as a pre-wet process performed before a chemical liquid puddle forming process to be described later. Since the chemical liquid is diffused onto the entire front surface of the wafer W instantly, in-surface uniformity in a contact time between the surface of the wafer W and the chemical liquid can be improved, and, as a consequence, the in-surface uniformity of the chemical liquid processing can be improved.

Further, if the chemical liquid is diffused onto the surface of the wafer W for a relatively long time (e.g., about 5 seconds) in the state that the wafer W is not rotated or rotated at a low speed, a foreign substance such as a particle may easily adhere to the surface of the wafer W. The foreign substance once attached is difficult to remove even by a subsequent rinsing processing or the like. In contrast, by diffusing the chemical liquid on the entire front surface of the wafer W instantly as described above, such a problem can be avoided.

After the chemical liquid is diffused on the entire front surface of the wafer W being rotated at the high speed (e.g., 500 rpm or higher), by reducing the rotation speed of the wafer W (for example, to equal to or less than ½ of the rotation speed in the high-speed rotation, specifically, about 10 rpm, for example) while keeping on supplying the chemical liquid onto the center of the wafer W, a liquid film of the chemical liquid (also referred to as "puddle of the chemical liquid") having a required film thickness can be formed on the surface of the wafer W.

The liquid film (assigned a notation "CHM") of the chemical liquid needs to be thick enough not to cause a problem in a processing result due to evaporation of the chemical liquid. In this process 4, a total amount of the chemical liquid supplied to the wafer W from the chemical liquid nozzle 701 is, e.g., 100 ml or less. Further, in the process 4, the temperature of the chemical liquid supplied onto the wafer W from the chemical liquid nozzle 701 may be set to be, for example, an appropriate temperature equal to or higher than the room temperature and equal to or less than the chemical liquid processing temperature Tc as long as the chemical liquid staying on the wafer W can be maintained at about 60° C.

Processing conditions for the process 4 are specified as follows.
Plate heating switch: OFF
Plate temperature: no control (decreases slowly due to heat dissipation)
Chamber feed rate: slightly larger than 0.4 m$^3$/min (0.5 m$^3$/min)

Cup exhaust rate: 0.4 m³/min

Wafer rotation number: 1000 rpm→10 rpm

Chemical liquid nozzle: discharge the chemical liquid from directly above the central portion of the wafer W Rinse nozzle: no discharge IPA nozzle: no discharge The chemical liquid supplied to the wafer W is supplied only in the process 4. The total amount of the chemical liquid supplied in the process 4 of forming the puddle of the chemical liquid is equal to about ⅕ to ⅒ of a total amount of the chemical liquid used in a conventional chemical liquid processing performed by continuously supplying the chemical liquid having an adjusted temperature onto the wafer W being rotated. That is, in the chemical liquid processing according to the present exemplary embodiment, the chemical liquid can be greatly saved as compared to the conventional method.

In the process 4, the rotation speed of the wafer W is not limited to being reduced only once (1000 rpm→10 rpm), but it can be reduced in two or more stages (for example, 1000 rpm→100 rpm→10 rpm).

[Process 5 (Liquid Film Heating Process)]

Figure 11E:
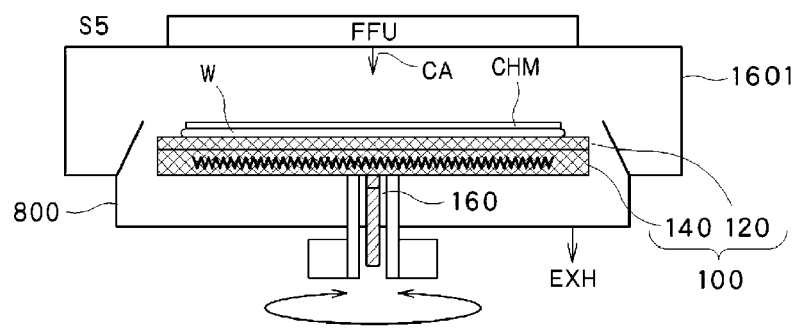

Next, the rotation of the wafer W is stopped, and by turning ON the switch device 160, the power is fed to the hot plate 140 so the hot plate 140 generates heat. Accordingly, the temperatures of the attraction plate 120, the wafer W attracted thereto and the chemical liquid on the wafer W are maintained at the aforementioned chemical liquid processing temperature Tc (60° C.). Further, as shown in FIG. 11E, by rotating the rotation table 100 (the attraction plate 120 and the wafer W) in the rocking manner, the chemical liquid forming the liquid film on the wafer W is agitated. As a result, a reaction between the chemical liquid and the surface of the wafer W is accelerated, and uniformity of the reaction is improved. By way of non-limiting example, this rocking rotation may be set to repeat a forward rotation of 45 degrees and a backward rotation of 45 degrees alternately. The angle of this rocking rotation may vary depending on a physical property (for example, viscosity) of the chemical liquid. Though it is desirable to perform this rocking rotation to improve the uniformity of the processing, the rocking rotation may not be performed, but the rotation may be simply stopped.

At this time, the chemical liquid nozzle 701 may be returned to the home position. If, however, the chemical liquid nozzle 701 and the rinse nozzle 702 are provided at the leading end of the single nozzle arm 704, as shown in FIG. 2, the chemical liquid nozzle 701 (that is, the rinse nozzle 702 as well) may be kept placed directly above the central portion of the wafer W. This is the same for the relationship between the rinse nozzle 702 and the drying accelerator liquid nozzle 703.

Processing conditions for the process 5 are as follows.

Plate heating switch: ON

Plate temperature: 60° C.

Chamber feed rate: 0.1 m³/min

Cup exhaust rate: 0.1 m³/min

Wafer rotation number: rocking rotation

Chemical liquid nozzle: no discharge

Rinse nozzle: no discharge

IPA nozzle: no discharge

During the process 5, the gas flow within the processing chamber 1601 is weakened by reducing the chamber feed rate and the cup exhaust rate to, e.g., 0.1 m³/min. Accordingly, a partial pressure of vapor originated from the chemical liquid within the processing chamber 1601 (for example, a partial pressure of water vapor, that is, humidity) is raised, so that evaporation or volatilization of the chemical liquid forming the liquid film is suppressed. Accordingly, a partial loss of the liquid film on the wafer W or an unacceptable fluctuation of the concentration of the chemical liquid can be suppressed. That is to say, the thickness of the liquid film (puddle) of the chemical liquid formed in the process 4 can be reduced further.

Further, the flow velocity of the clean air CA introduced into the liquid recovery cup 800 is relatively high near the peripheral portion of the wafer W. Thus, the peripheral portion of the wafer W and the vicinity thereof are easily cooled, so a temperature distribution of the chemical liquid within the surface of the wafer W tends to become non-uniform. This tendency is weakened by reducing the chamber feed rate and the cup exhaust rate as stated above, so that a reacting amount distribution of the chemical liquid within the surface of the wafer W can be uniformed.

In the actual apparatus, it is found out that a temperature range (highest temperature-lowest temperature within the surface of the wafer W) is improved by the agitation of the chemical liquid through the rocking rotation. As a specific example, when the chamber feed rate and the cup exhaust rate are set to be 0.4 m³/min, the temperature range is found to be 2.043° C. when there is no agitation of the chemical liquid by the rocking rotation, whereas the temperature range is found to be 1.072° C. when there is performed the agitation of the chemical liquid by the rocking rotation. When the chamber feed rate and the cup exhaust rate are reduced to 0.1 m³/min, the temperature range is found to be 1.377° C. when there is no agitation of the chemical liquid by the rocking rotation, whereas the temperature range is found to be 0.704° C. when there is performed the agitation of the chemical liquid by the rocking rotation. Further, when there is performed the agitation of the chemical liquid by the rocking rotation, an etching uniformity index is found to 2.9 and 1.9 when the chamber feed rate and the cup exhaust rate are set to be 0.4 m³/min and 0.1 m³/min, respectively. That is, it is found out that the in-surface uniformity of the chemical liquid processing is improved greatly. The etching uniformity index is calculated by the following formula:

Etching uniformity index=(maximum etching amount−minimum etching amount within the surface of the wafer $W$)/(an etching amount average×2).

[Process 6]

Figure 11F:
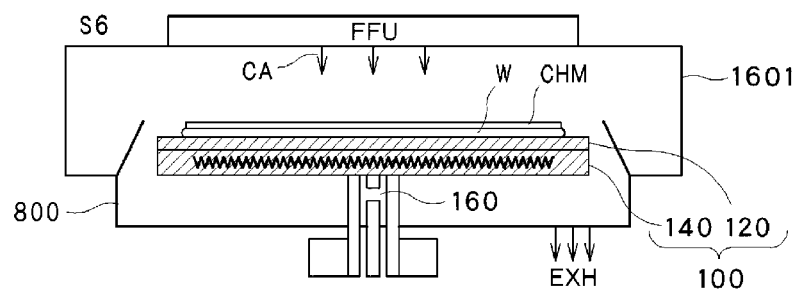

Subsequently, as illustrated in FIG. 11F, the switch device 160 is turned OFF. Accordingly, the temperature of the attraction plate 120 and the wafer W decreases gradually. Further, the rinse nozzle 702 (not shown in FIG. 11F) is placed at the position directly above the central portion of the wafer W or moved toward the position directly above the central portion of the wafer W. By increasing the chamber feed rate and the cup exhaust rate to, e.g., 0.8 m³/min, the gas flow within the processing chamber 1601 is strengthened.

Processing conditions for the process 6 are specified as follows.

Plate heating switch: OFF

Plate temperature: no control (decreases slowly due to heat dissipation)

Chamber feed rate: slightly larger than 0.8 m³/min

Cup exhaust rate: 0.8 m³/min

Wafer rotation number: 0 rpm

Chemical liquid nozzle: no discharge

Rinse nozzle: no discharge (moved to the position directly above the central portion of the wafer W)

IPA nozzle: no discharge

[Process 7]

Figure 11G:
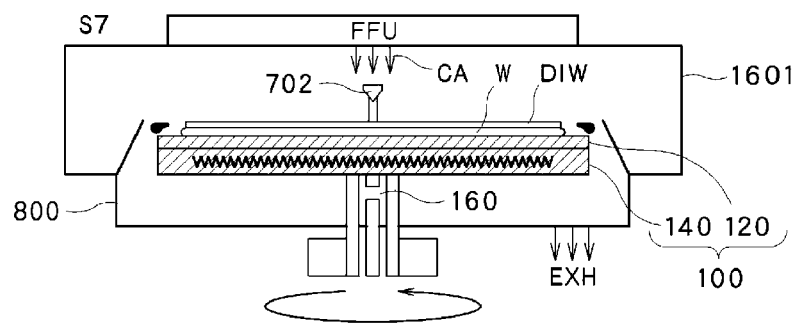

Thereafter, as depicted in FIG. 11G, the rinse liquid (here, DIW (pure water)) having the room temperature is supplied onto the center of the wafer W from the rinse nozzle 702 in the state that the wafer W is rotated at a relatively low speed (e.g., 100 rpm or less, specifically, about 30 rpm). Accordingly, the chemical liquid on the surface of the wafer W is washed away, and the reaction between the chemical liquid and the surface of the wafer W is stopped. Since the wafer W is rotated at the low speed, formation of a splash that might be caused as the chemical liquid and the rinse liquid scattered from the wafer W collide with the liquid recovery cup 800 is suppressed. Therefore, re-adhesion of mist of a liquid including the chemical liquid to the wafer W is suppressed.

Processing conditions for the process 7 are specified as follows.

Plate heating switch: OFF
Plate temperature: no control (decreases slowly due to heat dissipation and DIW)
Chamber feed rate: 0.8 m$^3$/min
Cup exhaust rate: 0.8 m$^3$/min
Wafer rotation number: 30 rpm
Chemical liquid nozzle: no discharge
Rinse nozzle: discharge DIW from directly above the central portion of the wafer W
IPA nozzle: no discharge

[Process 8]

Figure 11H:
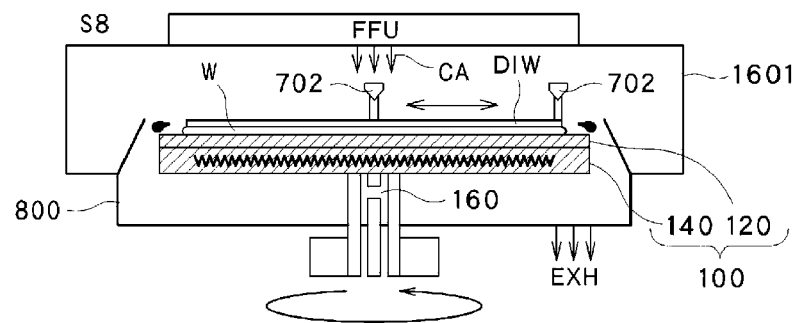

Subsequently, as illustrated in FIG. 11H, while keeping on supplying the DIW onto the center of the wafer W from the rinse nozzle 702, the rotation speed of the wafer W is increased to a high speed of about 1000 rpm. The DIW supplied onto the central portion of the wafer W being rotated at the high speed is flown while being diffused toward an edge of the wafer W, and is then scattered off the edge of the wafer W. Accordingly, the chemical liquid and the reaction product remaining on the front surface of the wafer W are washed away by the DIW. Further, in this process 7, the wafer W and the attraction plate 120 are deprived of heat by the DIW of the room temperature, and the temperature thereof falls down to about the room temperature. In the process 7, to reduce the temperature of the wafer W and the attraction plate 120 uniformly, the rinse nozzle 702 is moved back and forth between the position directly above the center of the wafer W and the position directly above the edge of the wafer W. Further, when moving the rinse nozzle 702 back and forth, the discharge amount of the DIW from the rinse nozzle 702 may be varied depending on the discharge position to thereby reduce the temperature more uniformly.

Processing conditions for the process 8 are specified as follows.

Plate heating switch: OFF
Plate temperature: no control (decreases almost to room temperature due to heat dissipation and DIW)
Chamber feed rate: 0.8 m$^3$/min
Cup exhaust rate: 0.8 m$^3$/min
Wafer rotation number: 1000 rpm
Chemical liquid nozzle: no discharge
Rinse nozzle: discharge DIW while being moved between the central portion and the peripheral portion of the wafer W
IPA nozzle: no discharge

[Process 9]

Figure 11I:
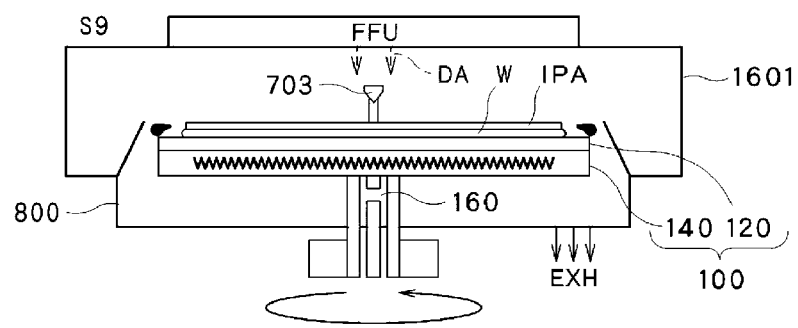

Thereafter, as shown in FIG. 11I, while maintaining the rotation speed of the wafer W, the discharge of the DIW from the rinse nozzle 702 is stopped, and the IPA having the room temperature is discharged onto the central portion of the wafer W from the drying accelerator liquid nozzle 703 which is located directly above the central portion of the wafer W. Through the process 9, the rinse liquid on the wafer W is replaced by the IPA discharged onto the central portion of the wafer W, so that the surface of the wafer W is covered with a liquid film of the IPA.

In performing the process 9, the gas to be supplied from the FFU is changed from the clean air (prepared by filtering air within the clean room with a HEPA filter) to dry air DA or a $N_2$ gas (nitrogen gas). The dry air has the same degree of cleanness as the clean air CA and has a dew point much lower than that of the clean air CA. Further, the $N_2$ gas has high degree of cleanness, and has an oxygen concentration and a moisture content much lower than those of the clean air CA. That is, the atmosphere within the processing chamber 1601 is changed to an atmosphere (for example, having a humidity of less than 1%) where condensation hardly occurs. At this time, the chamber feed rate (a supply rate of the dry air or $N_2$ gas) and the cup exhaust rate are set to be, e.g., about 0.4 m$^3$/min.

Processing conditions for the process 9 are specified as follows.

Plate heating switch: OFF
Plate temperature: no control (almost room temperature)
Chamber feed rate: slightly larger than 0.4 m$^3$/min
Cup exhaust rate: 0.4 m$^3$/min
Wafer rotation number: 1000 rpm
Chemical liquid nozzle: no discharge
Rinse nozzle: no discharge
IPA nozzle: discharge IPA from directly above the central portion of the wafer W

[Process 10]

Figure 11J:
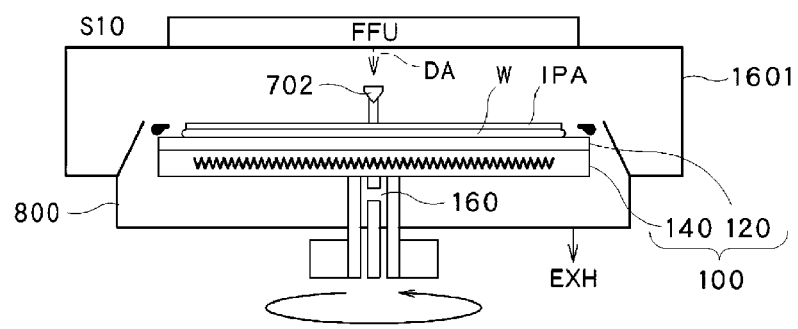

Subsequently, as depicted in FIG. 11J, while carrying on the supply of the IPA of the room temperature onto the center of the wafer W from the drying accelerator liquid nozzle 703, the rotation speed of the wafer W is reduced to a low speed of about 10 rpm. By reducing the rotation speed of the wafer W while continuing to supply the IPA onto the center of the wafer W, the liquid film of the IPA (also called "puddle of the IPA") having a required film thickness can be formed on the surface of the wafer W. The liquid film of the IPA just needs to have the thickness enough not to cause a problem in the processing result due to the evaporation of the IPA. At this time, the chamber feed rate (a supply rate of the dry air or $N_2$ gas) and the cup exhaust rate are set to be of appropriate values within a range from, e.g., 0.1 m$^3$/min to 0.4 m$^3$/min. The chamber feed rate and the cup exhaust rate are substantially same (desirably, the chamber feed rate is slightly larger).

In the process 10 (in the process 9 as well), if the IPA of the room temperature is supplied, the degree of cleanness of the IPA supplied onto the wafer W can be increased. If the IPA is supplied in a heated state, the heated IPA passes through a filter in a processing liquid supply device which supplies the IPA to the drying accelerator liquid nozzle 703. At this time, since an impurity which would be precipitated at the room temperature is dissolved in the heated IPA, a filtering effect of the filter is substantially degraded. By supplying the IPA of the room temperature, however, this problem can be avoided. Upon the completion of the process 10, the drying accelerator liquid nozzle 703 may be retreated to the home position.

Processing conditions for the process 10 are specified as follows.
  Plate heating switch: OFF
  Plate temperature: no control (approximately room temperature)
  Chamber feed rate: 0.1 m³/min to 0.4 m³/min (dry air or N₂ gas)
  Cup exhaust rate: 0.1 m³/min to 0.4 m³/min
  Wafer rotation number: 10 rpm
  Chemical liquid nozzle: no discharge
  Rinse nozzle: no discharge
  IPA nozzle: discharge IPA from directly above the central portion of the wafer W

[Process 11]

Figure 11K:
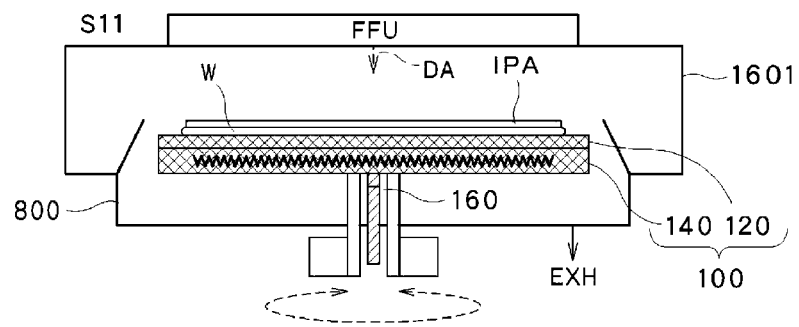

Subsequently, as depicted in FIG. 11K, the rotation of the wafer W is stopped, and by turning ON the switch device 160, the power is fed to the hot plate 140 so that the hot plate 140 generates heat. Accordingly, the temperatures of the attraction plate 120, the wafer W attracted thereto and the IPA on the wafer W are raised to, e.g., about 78° C. At this time, the rotary table 100 (the attraction plate 120 and the wafer W) may be rotated in the rocking manner, or the rotary table 100 may be stopped. At this time, the chamber feed rate and the cup exhaust rate are maintained at the low flow rate, and the evaporation or volatilization of the IPA forming the liquid film is suppressed. Accordingly, the partial loss of the liquid film at an undesirable position on the wafer W can be suppressed. By raising the temperature of the IPA, a surface tension of the IPA decreases, resulting in enhancement of an effect of suppressing a pattern collapse in a process 13 to be described later. Further, as a result of increasing the temperature of the IPA, a substance which can be dissolved in the IPA is actually dissolved in the IPA, so that the particle generation can be suppressed.

Processing conditions for the process 11 are as follows.
  Plate heating switch: ON
  Plate temperature: 78° C.
  Chamber feed rate: 0.1 m³/min to 0.4 m³/min (dry air or N₂ gas)
  Cup exhaust rate: 0.1 m³/min to 0.4 m³/min
  Wafer rotation number: 0 rpm (or rocking rotation)
  Chemical liquid nozzle: no discharge
  Rinse nozzle: no discharge
  IPA nozzle: no discharge

[Process 12]

Figure 11L:
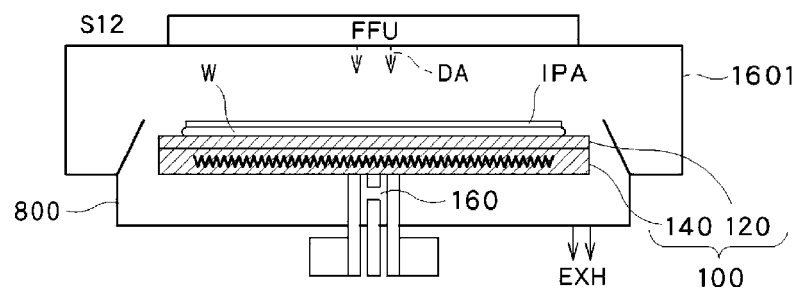

Next, as shown in FIG. 11L, the switch device 160 is turned OFF. Accordingly, the temperatures of the attraction plate 120 and the wafer W decrease slowly. By increasing the chamber feed rate and the cup exhaust rate to, e.g., 0.4 m³/min, the gas flow within the processing chamber 1601 is strengthened. Processing conditions for the process 12 are as follows.
  Plate heating switch: OFF
  Plate temperature: no control (decreases slowly due to heat dissipation)
  Chamber feed rate: slightly larger than 0.4 m³/min
  Cup exhaust rate: 0.4 m³/min
  Wafer rotation number: 0 rpm
  Chemical liquid nozzle: no discharge
  Rinse nozzle: no discharge
  IPA nozzle: no discharge

[Process 13]

Figure 11M:
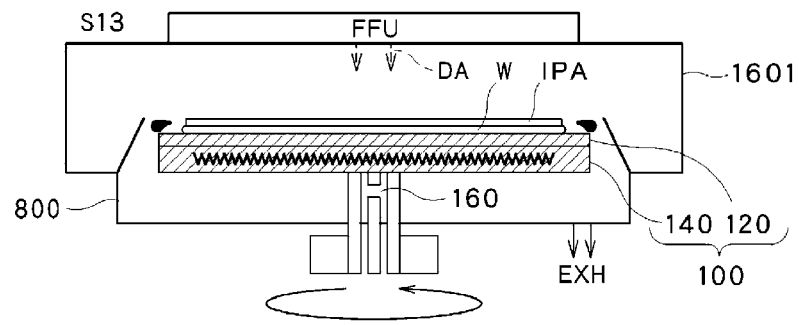

Subsequently, as depicted in FIG. 11M, by rotating the wafer W at a high speed ranging from about 1000 rpm to 1500 rpm, the IPA is scattered off the surface of the wafer W. Processing conditions for the process 13 are specified as follows.
  Plate heating switch: OFF
  Plate temperature: no control (decreases slowly due to heat dissipation)
  Chamber feed rate: slightly larger than 0.4 m³/min
  Cup exhaust rate: 0.4 m³/min
  Wafer rotation number: 1000 rpm
  Chemical liquid nozzle: no discharge
  Rinse nozzle: no discharge
  IPA nozzle: no discharge

[Process 14 (Wafer Carrying-Out Process)]

Figure 11N:
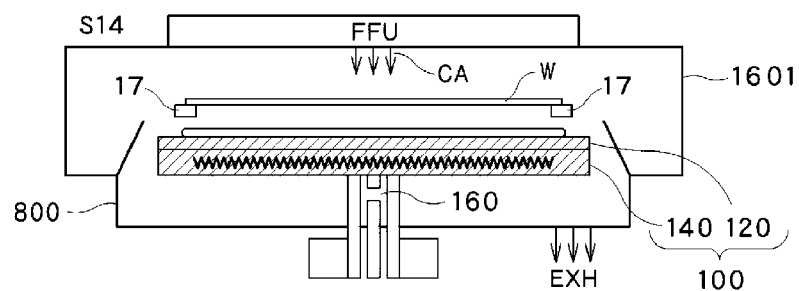

If the wafer W is dried, the gas to be supplied from the FFU is changed from the dry air to the clean air, as depicted in FIG. 11N. Then, by increasing the chamber feed rate and the cup exhaust rate to, e.g., 0.8 m³/min, the gas flow within the processing chamber 1601 is further strengthened. Then, the rotation of the wafer W is stopped, and the wafer W is taken out of the processing unit 16 by the arm of the substrate transfer device 17.

Processing conditions for the process 14 are specified as follows.
  Plate heating switch: OFF
  Plate temperature: no control (decreases slowly due to heat dissipation)
  Chamber feed rate: slightly larger than 0.8 m³/min
  Cup exhaust rate: 0.8 m³/min
  Wafer rotation number: 0 rpm
  Chemical liquid nozzle: no discharge
  Rinse nozzle: no discharge
  IPA nozzle: no discharge Details of the wafer carrying-out process will be described with reference to FIG. 2. First, the switching device (three-way valve) 156 is switched to change the connection destination of the suction line 153W from the suction device 154 to the purge gas supply device 155. Accordingly, the purge gas is supplied into the plate bottom surface suction path groove 121P, and the purge gas is supplied into the recess regions 125W on the top surface 120A of the attraction plate 120 through the substrate bottom surface suction path groove 121W. As a result, the attraction of the wafer W to the attraction plate 120 is released.

Accompanied by the above-stated operation, the attraction of the attraction plate 120 to the hot plate 140 is also released. Since the attraction of the attraction plate 120 to the hot plate 140 need not be released each time the processing upon the single sheet of wafer W is completed, a pipeline system in which this release of the attraction is not performed can be employed instead.

Then, the lift pins 211 are raised to the transfer position. Since the attraction of the wafer W to the attraction plate 120 is released through the above-stated purging operation, the wafer W can be easily separated from the attraction plate 120. Thus, the wafer W can be suppressed from having a flaw.

Afterwards, the wafer W placed on the lift pins 211 is lifted up by the arm (see FIG. 1 and FIG. 11N) of the substrate transfer device 17 and carried to the outside of the processing unit 16. Then, the absence of the wafer W on the attraction plate 120 is confirmed by the wafer sensor 860.

[Process 15]

Figure 11O:
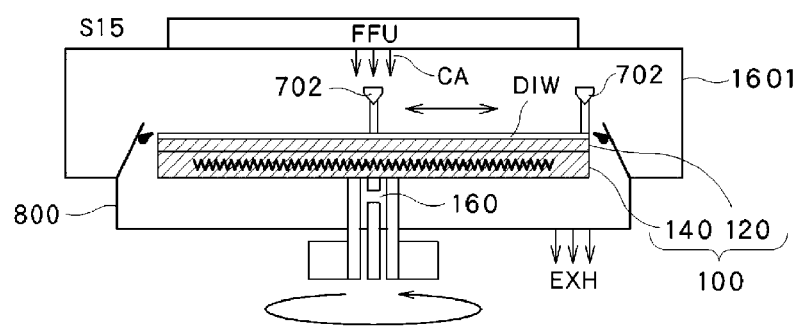

Subsequently, as shown in FIG. 11O, while maintaining the chamber feed rate and the cup exhaust rate, the rinse nozzle 702 is moved to the position directly above the central portion of the attraction plate 120 of the rotary table 100. The rotary table 100 is rotated at a rotation number equal to or less than about 1000 rpm. In this state, by supplying the DIW as the rinse liquid onto the central portion of the attraction plate 120 from the rinse nozzle 702, the surface of the attraction plate 120 is cleaned. By performing this cleaning process, contamination of the rear surface of the wafer W to be processed next can be suppressed.

In this process 15, the attraction plate 120 is deprived of heat by the DIW of the room temperature, and the temperature of the attraction plate 120 decreases to about the room temperature. In the process 15, the rinse nozzle 702 may be moved back and forth between the position directly above the center of the attraction plate 120 and the position directly above the edge of the wafer W. Accordingly, the entire surface of the attraction plate 120 can be cleaned uniformly, and the temperature of the attraction plate 120 can be reduced uniformly.

Processing conditions for the process 15 are specified as follows.
Plate heating switch: OFF
Plate temperature: no control (decreases slowly due to heat dissipation and DIW)
Chamber feed rate: slightly larger than 0.8 m$^3$/min
Cup exhaust rate: 0.8 m$^3$/min
Wafer rotation number: ~1000 rpm
Chemical liquid nozzle: no discharge
Rinse nozzle: discharge (fixed to the central portion of the wafer W, or moved between the central portion and the peripheral portion of the wafer W)
IPA nozzle: no discharge
[Process 16]

Figure 11P:
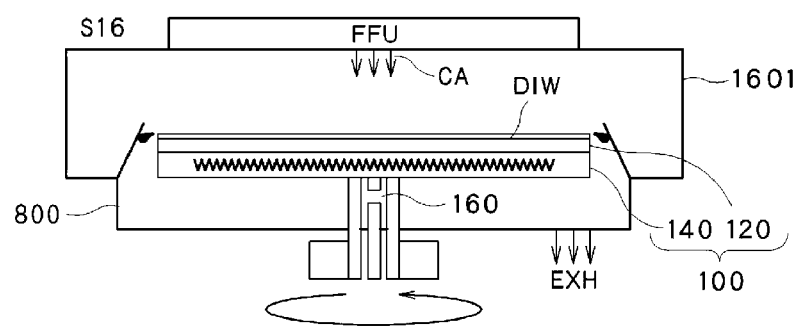

Then, as shown in FIG. 11P, the discharge of the DIW from the rinse nozzle 702 is stopped, and by rotating the rotary table 100 at a high speed ranging from 1000 rpm to 1500 rpm, the surface of the attraction plate 120 is dried by scattering. Through the above-described processes, operations of a single cycle (processes 1 to 16) in the processing unit 16 are completed. If there remains a wafer to be processed next, the processing returns to the process 1.

Processing conditions for the process 16 are as follows.
Plate heating switch: OFF
Plate temperature: no control (room temperature)
Chamber feed rate: slightly larger than 0.8 m$^3$/min
Cup exhaust rate: 0.8 m$^3$/min
Wafer rotation number: 1000 rpm to 1500 rpm
Chemical liquid nozzle: no discharge
Rinse nozzle: no discharge
IPA nozzle: no discharge First Modified Exemplary Embodiment In the above-described exemplary embodiment, the heated chemical liquid is supplied from the chemical liquid nozzle 701 in the processes 4 and 5. However, it is possible to supply the chemical liquid having the room temperature. By supplying the chemical liquid of the room temperature, it is possible to supply the chemical liquid having a high degree of cleanness. It is because a substance, which would be dissolved in the chemical liquid at a high temperature, is precipitated at the room temperature (the same as described for the reason why the IPA of the room temperature is supplied in the process 10) and thus can be filtered out efficiently through a filter which is provided in a chemical liquid supply system including the chemical liquid supply mechanism 701B. Further, in this case, since the wafer W is cooled by the chemical liquid of the room temperature, it takes time to increase the temperatures of the chemical liquid and the wafer W to the chemical liquid processing temperature Tc in the process 5.

The chemical liquid supply system configured to supply the temperature-adjusted chemical liquid may include a chemical liquid storage tank, a circulation line connected to the chemical liquid storage tank, and devices such as a pump, a heater and the filter provided in the circulation line, and may be mostly configured to send the processing liquid into the processing unit through a branch line branched off the circulation line. If the chemical liquid of the room temperature is supplied into the processing unit, this chemical liquid of the room temperature can be circulated and filtered through the filter, so that the degree of cleanness of the chemical liquid circulated through the tank and the circulation line can be improved. Further, since the temperature-adjusted chemical liquid is not circulated, a change in a composition of the chemical liquid or in a concentration thereof due to evaporation of a component of the chemical liquid can be avoided. In addition, if the chemical liquid of the room temperature is supplied, it is not required to provide the heater in the circulation line, and the chemical liquid can be supplied into the processing unit from the tank without passing through circulation line. Therefore, a cost of the substrate processing system can be reduced.

Second Modified Exemplary Embodiment

In the above-described exemplary embodiment, the liquid film (puddle) of the IPA formed in the process 10 is heated by heating the entire wafer W uniformly in the process 11, and removed by being scattered in the process 13. However, the present disclosure is not limited thereto. The liquid film of the IPA can be removed by using a Marangoni force, as shown in schematic diagrams of FIG. 12A to FIG. 12E, without needing to rotate the wafer W. In FIG. 12A to FIG. 12E, the hot plate 140 includes four concentric heating zones Z1, Z2, Z3 and Z4. The innermost heating zone Z1 is of a circular shape, and the heating zones Z2 to Z4 outside it are ring-shaped. Further, the heating zones Z2 to Z4 can be configured by heating, among the ten heating zones 143-1 to 143-10 described earlier with reference to FIG. 3, those having the same positions in the radial direction in the same manner.

Figure 12A:
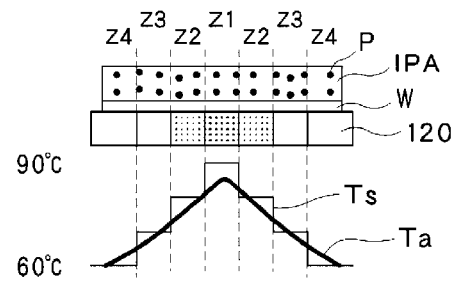
FIG. 12A to FIG. 12E are diagrams illustrating modification examples of a drying process.

First, as depicted in FIG. 12A, the power is fed to the hot plate 140 such that there is formed a temperature distribution in which the heating zone Z1 at the central portion of the wafer W has the highest temperature (e.g., 80° C. or higher) and temperatures of the heating zones Z2 to Z3 decrease as they come close to the edge of the wafer W. In FIG. 12A to FIG. 12E, a stair-shaped thin solid line assigned a reference numeral Ts indicates set temperatures of the respective heating zones Z1 to Z4, and a curve-shaped thick solid line Ta indicates an actual temperature distribution of the surface of the attraction plate 120 (that is, the wafer W).

Figure 12B:
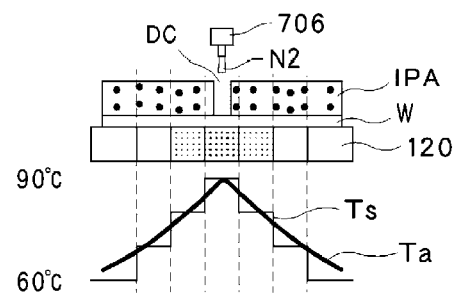

Then, as shown in FIG. 12B, a dry core DC is formed by discharging an inert gas such as a nitrogen gas ($N_2$ gas) from a gas nozzle 706. The gas nozzle 706 used here may be supported by the nozzle arm 704 which supports the aforementioned nozzles 701 to 703, or may be supported by another non-illustrated nozzle arm. Further, by forming the temperature distribution as depicted in FIG. 12A, the dry core can be formed even if the gas is not discharged. However, to form the dry core having an appropriate size at an appropriate position on the central portion of the wafer W at an appropriate time, it is desirable to discharge the gas.

Figure 12C:
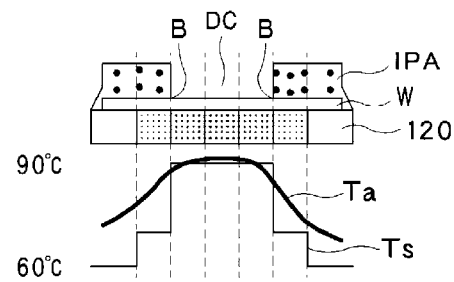
Figure 12D:
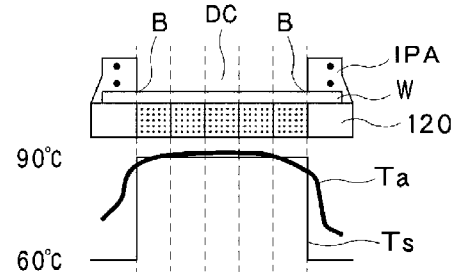
Figure 12E:
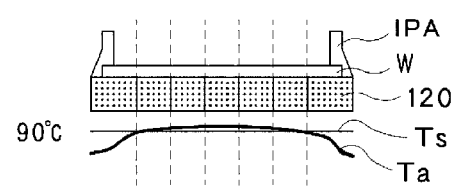

Due to the presence of the aforementioned temperature gradient, the dry core DC expands slowly outwards in the radial direction. At this time, by varying the temperature distribution, the dry core DC can be efficiently expanded by using the Marangoni force, as depicted in FIG. 12C to FIG. 12E. To elaborate, the temperature distribution is controlled such that a temperature at a gas-liquid interface B (meaning a boundary between the dry core and the IPA liquid film on the front surface of the wafer W) and a region inside it in the radial direction is the highest and, also, such that the temperature of the corresponding region becomes about 90° C. In such a case, since the temperature at the dry core DC side inside the gas-liquid interface B in the radial direction is relatively high, a surface tension thereat is small, whereas since a temperature at the IPA liquid film side outside the gas-liquid interface B in the radial direction is relatively low, the surface tension increases thereat. Accordingly, the IPA liquid film is moved outwards in the radial direction by using the Marangoni force as a driving force. Since the gas-liquid interface B is slowly moved outwards in the radial direction, it is possible to move the gas-liquid interface B outwards in the radial direction continuously while maintaining the temperature of the liquid of the IPA near the gas-liquid interface B at about 90° C., by repeating the operation of increasing, if the gas-liquid interface B is moved from the current heating zone to the outer heating zone right next to it, the temperature of this outer heating zone to 90° C. During this process, the IPA on the wafer W falls off the edge of the wafer W or evaporates. Finally, as shown in FIG. 12E, the dry core DC is expanded to the edge of the wafer W, so that the wafer W is dried.

In the above-stated drying process, the IPA forming the liquid film is moved outwards in the radial direction while maintaining fluidity thereof. Since the IPA has the fluidity, particles P (indicated by dots in FIG. 12A to FIG. 12E) existing in the IPA liquid film can be moved outwards in the radial direction when the IPA liquid film is moved. Therefore, the particles P can be suppressed from being left on the surface of the wafer W.

In this second modified exemplary embodiment, processes 1 to 10 are the same as those described in the above-described exemplary embodiment. Then, a process 11A is performed instead of the processes 11 to 13. Upon the completion of the process 11A, the processing proceeds to a process 14.

Processing conditions for the process 11A are specified as follows.

Plate heating switch: ON

Plate temperature: 100° C. at maximum (zone temperature control to be described below)

Chamber feed rate: 0.2 m³/min to 0.4 m³/min (supply dry air or N₂ gas)

Cup exhaust rate: 0.2 m³/min to 0.4 m³/min

Wafer rotation number: 0 rpm

Chemical liquid nozzle: no discharge

Rinse nozzle: no discharge

IPA nozzle: no discharge

Further, if the liquid film of the IPA is removed by the scattering as in the process 13 of the above-described exemplary embodiment, the liquid film of the IPA is immediately thinned when the rotation number of the wafer W is increased. Accordingly, the particles existing in the liquid film of the IPA may be difficult to move outwards in the radial direction of the wafer W. Thus, as compared to the second modified exemplary embodiment, the particles tend to be left on the front surface of the wafer W easily.

In an actual apparatus, an increment of the particles having a size equal to or larger than 19 nm is found to be 12.3 in average when the process 11A is performed, which shows a great improvement as compared to the case where the processes 11 to 13 are performed, where the increment of the particles is found to be 33 in average.

Third Modified Exemplary Embodiment

The power feed to the heater 142 of the hot plate 140 may be carried out through a power transmission device capable of feeding the power to the heater 142 even when the rotary table is rotated continuously in one direction, instead of using the switch device 160 which is incapable of feeding the power to the heater 142 when the rotary table is rotated. Some configuration examples of this power transmission device will be described below.

Figure 13:
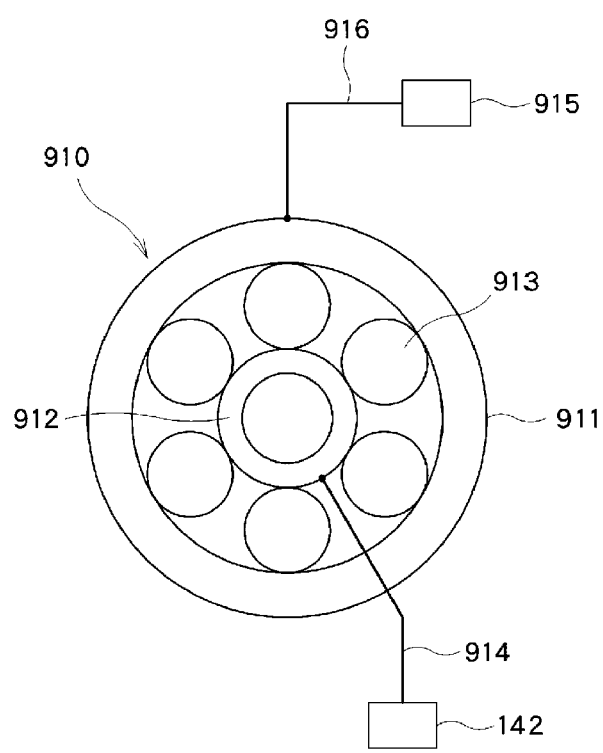
FIG. 13 is a schematic diagram for describing the principle of a first configuration example of a power transmission device which enables a power feed to the heater of the hot plate without needing to use a switch device.
Figure 14:
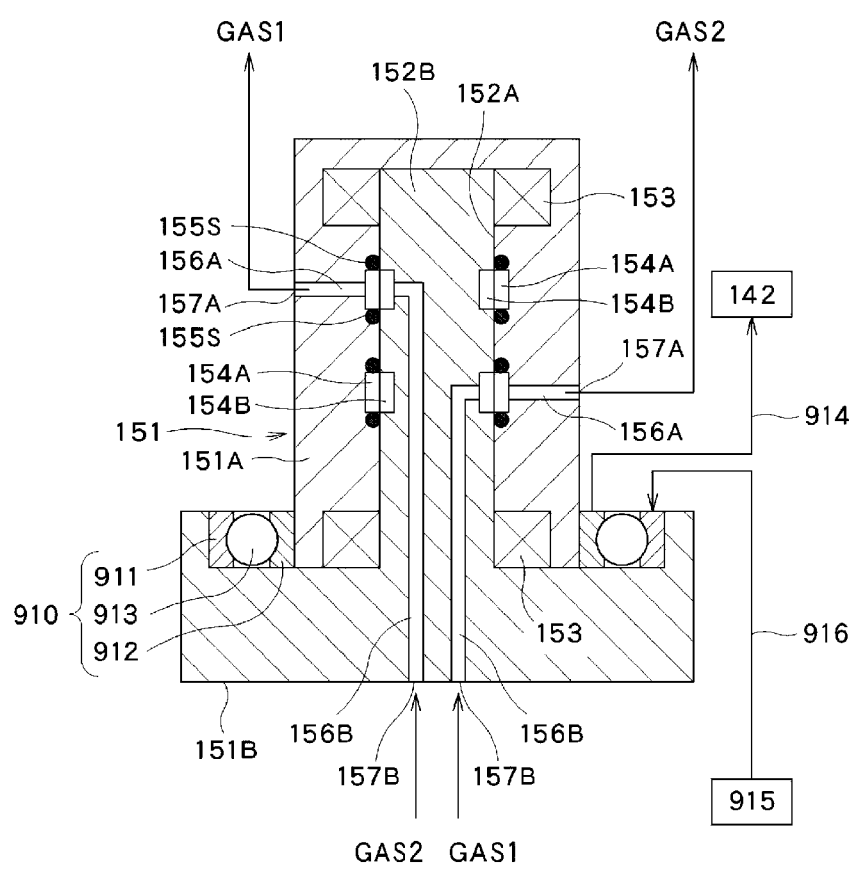
FIG. 14 is a schematic axial cross sectional view illustrating the first configuration example of the power transmission device shown in FIG. 13.

A power transmission device 910 according to a first configuration example will be described with reference to FIG. 13 and FIG. 14. FIG. 13 is a diagram for describing operation principle of the power transmission device 910, and FIG. 14 provides an axial cross sectional view thereof. The power transmission device 910 is a contact type power transmission device. The power transmission device is provided coaxially with respect to the rotary joint 151. Desirably, the power transmission device 910 is mounted to the rotary joint 151 or configured as one body therewith.

As depicted in FIG. 13, the power transmission device 910 has a configuration similar to that of a rolling bearing (a ball or a roller bearing), and includes an outer race 911, an inner race 912 and a plurality of rolling elements (for example, balls) 913. The outer race 911, the inner race 912 and the rolling elements 913 are made of a conductive material (conductor). Desirably, an appropriate pre-load is applied between the constituent components 911, 912 and 913 of the power transmission device 910. By doing so, more stable electric conduction between the outer race 911 and the inner race 912 via the rolling elements 913 can be achieved.

A specific example of the rotary joint 151 equipped with the power transmission device 910 operated based on the above-described operation principle is illustrated in FIG. 14. The rotary joint 151 has a lower piece 151B fixed to a frame provided within the housing 1601 or fixed to a bracket fastened to the frame (both are not shown); and an upper piece 151A fixed to the rotary table 100 or a member (not shown) configured to be rotated along with the rotary table 100.

Though the configuration of the rotary joint 151 itself shown in FIG. 14 is commonly known in the art, it will be briefly described here. That is, a cylindrical center protrusion 152B of the lower piece 151B is inserted in a cylindrical center hole 152A of the upper piece 151A. The center protrusion 152B is supported at the upper piece 151A by being held between a pair of bearings 153. Cylindrical grooves 154A are formed on an inner cylindrical surface of the center hole 152A. The number of the cylindrical grooves 154A equals to the number of the kinds of gases used (though GAS1 and GAS2 are illustrated in FIG. 14, the number of the kinds of the gases is not limited thereto). Seal rings 155S for suppressing a leak of a gas are provided next to each cylindrical groove 154A.

Gas passages 156A respectively communicating with the cylindrical grooves 154A are formed within the upper piece 151A. An end of each gas passage 156A is configured as a gas output port 157A. A plurality of cylindrical grooves 154B is formed on an outer cylindrical surface of the center protrusion 152B to be located at axial positions respectively corresponding to the plurality of cylindrical grooves 154A. Gas passages 156B respectively communicating with the cylindrical grooves 154B are formed within the lower piece 151B. An end of each gas passage 156B is configured as a gas inlet port 157B.

According to the configuration shown in FIG. 14, a gas can be flown between the gas inlet port 157B and the gas outlet port 157A substantially with no leak even when the upper piece 151A and the lower piece 151B are being rotated. Further, a suction force can also be applied between the gas inlet port 157B and the gas outlet port 157A.

The power transmission device 910 is mounted between the upper piece 151A and the lower piece 151B of the rotary joint 151. In the example of FIG. 14, the outer race 911 is insertion-fitted (for example, press-fitted) into a cylindrical recess of the lower piece 151B, and a cylindrical outer surface of the upper piece 151A is insertion-fitted (press-fitted) into the inner race 912. A gap between the outer race 911 and the lower piece 151B and a gap between the upper piece 151A and the inner race 912 are electrically insulated appropriately.

The outer race 911 is electrically connected to a power supply (or power feed controller) 915 via an electric wire 916, and the inner race 912 is electrically connected to the heater 142 of the hot plate 140 via an electric wire 914. Further, in the example of FIG. 14, the inner race 912 is a rotary member which rotates as one body with the rotary table 100, and the outer race 911 is a non-rotary member. The power supply 915 may be a part of the power feeder 300 shown in FIG. 2.

In the configuration shown in FIG. 14, by providing rolling bearings of the power transmission device 910 in multiple levels while maintaining the rolling bearings insulated from each other in an axis direction, it is possible to perform multi-channel power feeding. In this case, power feed can be performed for the respective heating zones 143-1 to 143-10 of the hot plate 140 independently.

To apply the first configuration example of the third modified exemplary embodiment, the rotary joint 151 and the switch device 160 of the processing unit 16 shown in FIG. 2 need to be replaced by the device described in FIG. 13 and FIG. 14.

Now, a power transmission device 920 according to a second configuration example will be explained with reference to FIG. 15. The power transmission device 920 is also configured as a contact type power transmission device. The power transmission device 920 shown in FIG. 15 itself is composed of a commonly known slip ring and configured to be capable of performing multi-channel power feeding. In this case as well, it is possible to feed power to the plurality of heating zones 143-1 to 143-10 of the hot plate 140 independently.

The slip ring is composed of a rotating ring as a conductor and a brush.

The slip ring includes a fixed part 921 and a rotating part 922. The fixed part 921 is fixed to a frame provided within the housing 1601 or a bracket fastened thereto (both are not illustrated). The rotating part 922 is fixed to the rotary table 100 or the member (not shown) configured to be rotated along with the rotary table 100. A plurality of terminals, which are connected to electric wires 923 electrically connected with a power supply or a power feed controller (not shown), is provided on a side surface of the fixing part 921. A plurality of electric wires 924 respectively connected with the plurality of terminals electrically is extended from an axial end surface of the rotating part 922, and these electric wires 924 are respectively connected with the heater elements 142E of the heating zones 143-1 to 143-10 of the hot plate 140 electrically.

Figure 15:
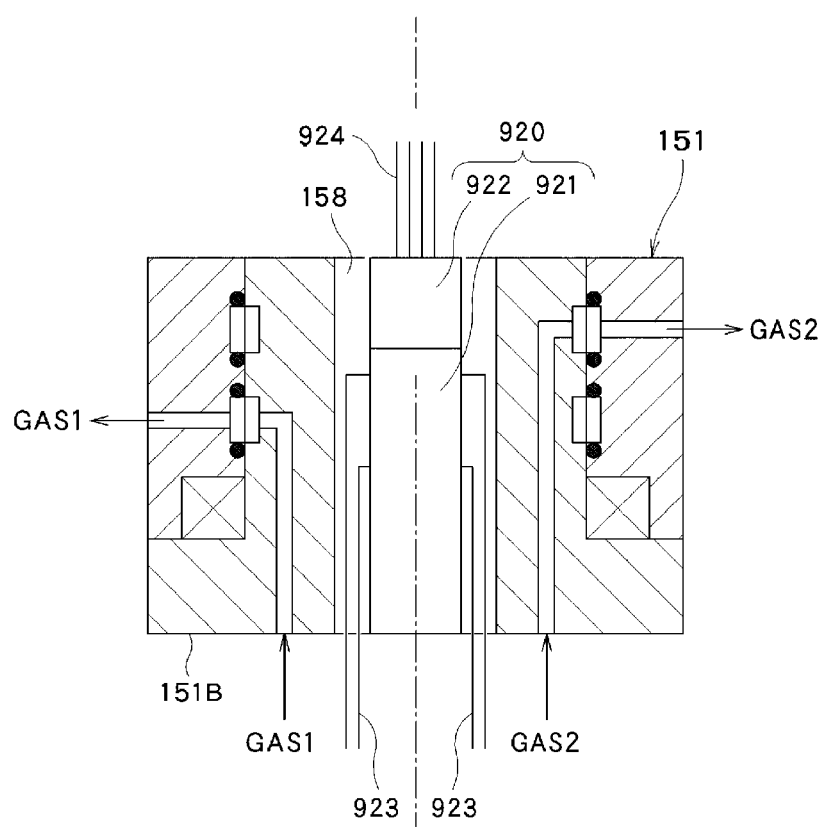
FIG. 15 is a schematic axial cross sectional view illustrating a second configuration example of the power transmission device which enables a power feed to the heater of the hot plate without needing to use a switch device.

In the configuration example of FIG. 15, the lower piece 151B of the rotary joint 151 is configured as a hollow member having a through hole 158 at the center thereof. The power transmission device 920 configured as the slip ring is accommodated within the through hole. The same as in the configuration example of FIG. 14, the lower piece 151B of the rotary joint 151 is fixed to the frame provided within the housing 1601 or the bracket fastened thereto (both are not shown). Further, the upper piece 151A of the rotary joint 151 is fixed to the rotary table 100 or the member (not shown) configured to be rotated along with the rotary table 100.

To apply the second configuration example of the third modified exemplary embodiment, the rotary joint 151 and the switch device 160 of the processing unit 16 shown in FIG. 2 need to be replaced by the device shown in FIG. 15.

As a third configuration example of the power transmission device, a wireless (non-contact type) power transmission device of a magnetic resonance type or an electromagnetic induction type using magnetic coupling (this power transmission device itself is known in the art) may be used. In this case, the wireless power transmission device is equipped with, as schematically illustrated in FIG. 2, a power transmitting coil 903 and a power receiving coil 902 which are extended along a circumferential direction and disposed to face each other with a gap therebetween. A ferrite sheet (not shown) for collecting a magnetic flux and suppressing a leak of a magnetic field is fastened around the power transmitting coil 903 and the power receiving coil 902. The power transmitting coil 903 may be fixed to a non-rotary member, for example, a stationary outer cup element 801, and the power receiving coil 902 may be fastened to a rotary member, for example, the support plate 170. The power receiving coil 902 is electrically connected to the heater 142 of the hot plate 140 via a non-illustrated electric wire. The power transmitting coil 903 is electrically connected to a non-illustrated power supply (or a power feed controller) via a non-illustrated electric wire.

When using the above-described non-contact type power transmission device as well, multi-channel power feeding can be performed by providing multiple sets of power transmitting coils 903 and power receiving coils 902.

To apply the third configuration example of the third modified exemplary embodiment, the switch device 160 of the processing unit 16 shown in FIG. 2 needs to be replaced by the power transmitting devices 902 (903) shown in FIG. 2.

In applying the first to third configuration examples of the third modified exemplary embodiment, a distributer configured to distribute the power sent via the power transmission device into multiple channels and a control module configured to control power feed to the individual heating zones (both are not shown) may be provided at appropriate positions within the space S between the hot plate 140 and the support plate 170. With this configuration, even if the power transmission device is designed to correspond to a single channel, it is possible to perform power feed to the respective heating zones 143-1 to 143-10 of the hot plate 140 independently.

In case that the power transmission device is configured to be capable of performing the multi-channel power transmission, one or more transmission channels may be used to transmit control signals or detection signals, or to take earth.

In case that the configurations according to the third modified exemplary embodiment are applied, the above-described chemical liquid processing (the processes 1 to 16, and the processes according to the first and second modified exemplary embodiments) for the wafer W can also be performed. In this case, since the power can be fed to the heater 142 of the hot plate 140 even if the rotation of the wafer W is not stopped, the wafer W can be rotated at, for example, a low speed in a process (for example, the process 11) where the rotary table is stopped or rotated in a rocking manner to heat the wafer W and/or the processing liquid.

It should be noted that the above-described exemplary embodiment is illustrative in all aspects and is not anyway limiting. The above-described exemplary embodiment may be omitted, replaced and modified in various ways without departing from the scope and the spirit of claims.

The substrate as the processing target is not limited to the semiconductor wafer, and various other kinds of substrates such as a glass substrate or a ceramic substrate for use in the manufacture of a semiconductor device may be used.

According to the exemplary embodiment, it is possible to perform a processing with high in-surface uniformity while reducing a consumption of the chemical liquid when performing a chemical liquid processing while heating the substrate.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting. The scope of the inventive concept is defined by the following claims and their equivalents rather than by the detailed description of the exemplary embodiments. It shall be understood that all modifications and embodiments conceived from the meaning and scope of the claims and their equivalents are included in the scope of the inventive concept.

We claim:

1. A substrate processing method performed by using a substrate processing apparatus,
wherein the substrate processing apparatus comprises:
a rotary table configured to hold a substrate horizontally and rotate the substrate around a vertical axis;
an electric heater provided in the rotary table to be rotated along with the rotary table and configured to heat the substrate placed on the rotary table;
at least one processing nozzle configured to supply a processing liquid onto a front surface of the substrate held on the rotary table; and
a processing liquid supply device configured to supply the processing liquid to the at least one processing liquid nozzle,
a switch device comprising a power receiving electrode electrically connected to the electric heater and configured to be rotated along with the rotary table, a power feeding electrode configured to be in contact with the power receiving electrode and configured to supply a driving power to the electric heater via the power receiving electrode, and an electrode moving device configured to connect/disconnect the power feeding electrode and the power receiving electrode to/from each other; and
a power feeder configured to supply the driving power to the power feeding electrode,
wherein the substrate processing method comprises:
holding the substrate on the rotary table;
forming, by supplying a chemical liquid as the processing liquid onto a central portion of the substrate while rotating the rotary table at a first speed, a liquid film of the chemical liquid having a first thickness on an entirety of the front surface of the substrate;
forming, by supplying the chemical liquid onto the central portion of the substrate while rotating the rotary table at a second speed lower than the first speed after the forming of the liquid film of the chemical liquid having the first thickness, a liquid film of the chemical liquid having a second thickness larger than the first thickness on the entirety of the front surface of the substrate; and
heating, by heating the rotary table with the electric heater in a state that the rotary table is rotated at a third speed equal to or lower than the second speed, in a state that the rotary table is rotated in a rocking manner or in a state that the rotating of the rotary table is stopped after the forming of the liquid film of the chemical liquid having the second thickness, the substrate and the liquid film of the chemical liquid formed on the substrate to thereby accelerate a reaction between the chemical liquid and the front surface of the substrate,
wherein the forming of the liquid film of the chemical liquid having the first thickness and the forming of the liquid film of the chemical liquid having the second thickness are performed in a state that the power feeding electrode and the power receiving electrode are spaced apart from each other,
after the forming of the liquid film of the chemical liquid having the second thickness, the rotating of the rotary table is stopped and the power feeding electrode and the power receiving electrode are in contact with each other, and
the heating of the substrate and the liquid film of the chemical liquid is performed in a state that the power feeding electrode and the power receiving electrode are in contact with each other.

2. The substrate processing method of claim 1,
wherein the switch device is configured to allow the rotary table to be rotated within a limited angular range of between ±180 degrees but not to be rotated continuously when the power feeding electrode and the power receiving electrode are in contact with each other, and also configured to allow the rotary table to be rotated continuously when the power feeding electrode and the power receiving electrode are spaced apart from each other,
the heating of the substrate and the liquid film of the chemical liquid is performed while rotating the substrate in the rocking manner within the limited angular range.

3. The substrate processing method of claim 1,
wherein the first speed is equal to or larger than 500 rpm, and the second speed is equal to or less than a half of the first speed.

4. The substrate processing method of claim 1,
wherein the chemical liquid supplied onto the substrate in the forming of the liquid film of the chemical liquid having the first thickness and the forming of the liquid film of the chemical liquid having the second thickness is not heated.

5. The substrate processing method of claim 1, further comprising:
removing, by supplying a rinse liquid onto the substrate after the heating of the substrate and the liquid film of the chemical liquid, the chemical liquid from the substrate;
replacing, by supplying a drying solvent having a lower surface tension and higher volatility than that of the rinse liquid onto the substrate after the removing of the chemical liquid from the substrate, the rinse liquid on the substrate with the drying solvent; and drying, by removing the drying solvent from the substrate after the replacing of the rinse liquid on the substrate with the drying solvent, the substrate, wherein the drying of the substrate includes heating the rotary table such that the substrate has a temperature gradient where a temperature at the central portion of the substrate is higher than a temperature at a peripheral portion of the substrate.

6. The substrate processing method of claim 2, wherein the first speed is equal to or larger than 500 rpm, and the second speed is equal to or less than a half of the first speed.

7. The substrate processing method of claim 2, further comprising:

heating, after the holding of the substrate and before the forming of the liquid film of the chemical liquid having the first thickness, the rotary table and the substrate thereon in the state that the power feeding electrode and the power receiving electrode are in contact with each other, wherein the power feeding electrode and the power receiving electrode are spaced apart from each other after the heating of the rotary table and the substrate and before the forming of the liquid film of the chemical liquid having the first thickness.

8. The substrate processing method of claim 2, wherein the chemical liquid supplied onto the substrate in the forming of the liquid film of the chemical liquid having the first thickness and the forming of the liquid film of the chemical liquid having the second thickness is not heated.

9. The substrate processing method of claim 2, further comprising:

removing, by supplying a rinse liquid onto the substrate after the heating of the substrate and the liquid film of the chemical liquid, the chemical liquid from the substrate;

replacing, by supplying a drying solvent having a lower surface tension and higher volatility than that of the rinse liquid onto the substrate after the removing of the chemical liquid from the substrate, the rinse liquid on the substrate with the drying solvent; and drying, by removing the drying solvent from the substrate after the replacing of the rinse liquid on the substrate with the drying solvent, the substrate, wherein the drying of the substrate includes heating the rotary table such that the substrate has a temperature gradient where a temperature at the central portion of the substrate is higher than a temperature at a peripheral portion of the substrate.

10. The substrate processing method of claim 3, further comprising:

heating, after the holding of the substrate and before the forming of the liquid film of the chemical liquid having the first thickness, the rotary table and the substrate thereon in the state that the power feeding electrode and the power receiving electrode are in contact with each other, wherein the power feeding electrode and the power receiving electrode are spaced apart from each other after the heating of the rotary table and the substrate and before the forming of the liquid film of the chemical liquid having the first thickness.

11. The substrate processing method of claim 5, wherein the drying of the substrate is performed in the state that the rotating of the rotary table is stopped or in the state that the rotary table is rotated in the rocking manner.

12. The substrate processing method of claim 6, further comprising:

heating, after the holding of the substrate and before the forming of the liquid film of the chemical liquid having the first thickness, the rotary table and the substrate thereon in the state that the power feeding electrode and the power receiving electrode are in contact with each other, wherein the power feeding electrode and the power receiving electrode are spaced apart from each other after the heating of the rotary table and the substrate and before the forming of the liquid film of the chemical liquid having the first thickness.

13. The substrate processing method of claim 7, wherein the substrate is heated in the heating of the rotary table and the substrate to a temperature higher than a temperature of the substrate in the heating of the substrate and the liquid film of the chemical liquid by $\Delta T°$ C. (T is equal to or less than 10° C.), and, then, the forming of the liquid film of the chemical liquid having the first thickness is performed.

14. The substrate processing method of claim 9, wherein the drying of the substrate is performed in the state that the rotating of the rotary table is stopped or in the state that the rotary table is rotated in the rocking manner.

15. The substrate processing method of claim 14, wherein the drying of the substrate is performed in the state that the power feeding electrode and the power receiving electrode are in contact with each other.

* * * * *

UNITED STATES PATENT AND TRADEMARK OFFICE
CERTIFICATE OF CORRECTION

PATENT NO. : 11,600,500 B2
APPLICATION NO. : 17/371384
DATED : March 7, 2023
INVENTOR(S) : Kouzou Tachibana et al.

It is certified that error appears in the above-identified patent and that said Letters Patent is hereby corrected as shown below:

In the Specification

Column 15, Line 7, "1616" should be -- 161B --.

Column 15, Line 11, "1616" should be -- 161B --.

Signed and Sealed this
Twenty-first Day of November, 2023

Katherine Kelly Vidal
*Director of the United States Patent and Trademark Office*